United States Patent
Yang

(10) Patent No.: US 11,398,285 B2
(45) Date of Patent: *Jul. 26, 2022

(54) MEMORY CELL MIS-SHAPE MITIGATION

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/910,504

(22) Filed: Jun. 24, 2020

(65) Prior Publication Data

US 2020/0365218 A1   Nov. 19, 2020

Related U.S. Application Data

(63) Continuation of application No. 16/414,577, filed on May 16, 2019, now Pat. No. 10,910,076.

(51) Int. Cl.

| | | |
|---|---|---|
| *G11C 16/34* | (2006.01) | |
| *G11C 16/10* | (2006.01) | |
| *G11C 16/04* | (2006.01) | |
| *H01L 27/11582* | (2017.01) | |
| *G11C 16/14* | (2006.01) | |

(52) U.S. Cl.
CPC ...... *G11C 16/3459* (2013.01); *G11C 16/0483* (2013.01); *G11C 16/10* (2013.01); *G11C 16/14* (2013.01); *G11C 16/3445* (2013.01); *H01L 27/11582* (2013.01)

(58) Field of Classification Search
CPC . G11C 16/3459; G11C 16/0483; G11C 16/10; G11C 16/14; G11C 16/3445

USPC .................................................. 365/185.11
See application file for complete search history.

(56) References Cited

U.S. PATENT DOCUMENTS

| | | | |
|---|---|---|---|
| 6,888,758 B1 | 5/2005 | Hemink et al. | |
| 7,020,017 B2 | 3/2006 | Chen et al. | |
| 7,349,263 B2 | 3/2008 | Kim et al. | |

(Continued)

FOREIGN PATENT DOCUMENTS

| | | | |
|---|---|---|---|
| JP | 2013525935 A | 6/2013 | |
| JP | 2013254542 A | 12/2013 | |

(Continued)

OTHER PUBLICATIONS

U.S. Appl. No. 16/414,577, filed May 16, 2019.

(Continued)

*Primary Examiner* — Sung Il Cho
(74) *Attorney, Agent, or Firm* — Vierra Magen Marcus LLP

(57) ABSTRACT

Techniques are provided for mitigating issues of memory hole mis-shape. In one aspect, one or more control circuits are configured to program a group of non-volatile memory cells from an erase state to a plurality of programmed states using a first program parameter. The one or more control circuits measure threshold voltages of the group to determine a severity of memory hole mis-shape in the group. The one or more control circuits program the group from the erase state to the plurality of programmed states using a second program parameter selected based on the severity of the memory hole mis-shape in the group.

20 Claims, 15 Drawing Sheets

(56) References Cited

U.S. PATENT DOCUMENTS

| | | |
|---|---|---|
| 7,633,807 B2 | 12/2009 | Chen et al. |
| 7,920,427 B2 | 4/2011 | Marquart |
| 8,321,727 B2 | 11/2012 | D'Abreu et al. |
| 8,737,130 B2 | 5/2014 | D'Abreu et al. |
| 8,971,128 B2 | 3/2015 | Chin et al. |
| 9,036,417 B2 | 5/2015 | Chen et al. |
| 9,514,827 B1 | 12/2016 | Nam et al. |
| 9,852,800 B2 | 12/2017 | Lang et al. |
| 10,223,028 B2 | 3/2019 | Gorobets et al. |
| 10,223,029 B2 | 3/2019 | Gorobets et al. |
| 2005/0185464 A1* | 8/2005 | Chih .................. G11C 16/0425 365/185.11 |
| 2011/0194346 A1 | 8/2011 | Yoon et al. |
| 2012/0127807 A1 | 5/2012 | Pio |
| 2014/0108705 A1* | 4/2014 | Gorobets ............ G11C 11/5628 711/103 |
| 2014/0293699 A1* | 10/2014 | Yang ...................... G11C 16/10 365/185.24 |
| 2015/0109862 A1 | 4/2015 | Shibata et al. |
| 2015/0279474 A1 | 10/2015 | Shimura et al. |
| 2016/0179407 A1 | 6/2016 | Gorobets et al. |
| 2017/0091039 A1 | 3/2017 | Hong |
| 2017/0287568 A1* | 10/2017 | Yang .................. G11C 16/3427 |
| 2018/0260134 A1* | 9/2018 | Li ...................... G11C 11/5628 |
| 2018/0286485 A1* | 10/2018 | Takizawa ............ G11C 16/0483 |
| 2018/0374541 A1* | 12/2018 | Jung .................... G11C 16/20 |
| 2019/0180832 A1* | 6/2019 | Roh ...................... G11C 16/32 |
| 2019/0371419 A1* | 12/2019 | Ema ...................... G11C 16/08 |
| 2020/0075110 A1* | 3/2020 | Suzuki .................. G11C 16/08 |
| 2020/0111535 A1* | 4/2020 | Han .................. G11C 16/3409 |
| 2020/0135283 A1* | 4/2020 | Park ...................... G11C 16/16 |

FOREIGN PATENT DOCUMENTS

| | | |
|---|---|---|
| KR | 20150099729 A | 9/2015 |
| KR | 20150125672 A | 11/2015 |
| KR | 20160018466 A | 2/2016 |
| KR | 20170116068 A | 10/2017 |
| KR | 20180087322 A | 8/2018 |

OTHER PUBLICATIONS

Restriction Requirement dated Jun. 16, 2020, U.S. Appl. No. 16/414,577, filed May 16, 2019.

Notice of Allowance dated Oct. 22, 2020, U.S. Appl. No. 16/414,577, filed May 16, 2019.

Response to Restriction Requirement dated Jul. 9, 2020, U.S. Appl. No. 16/414,577, filed May 16, 2019.

Non-final Office Action dated Jul. 17, 2020, U.S. Appl. No. 16/414,577, filed May 16, 2019.

Response to Office Action dated Sep. 28, 2020, U.S. Appl. No. 16/414,577, filed May 16, 2019.

* cited by examiner

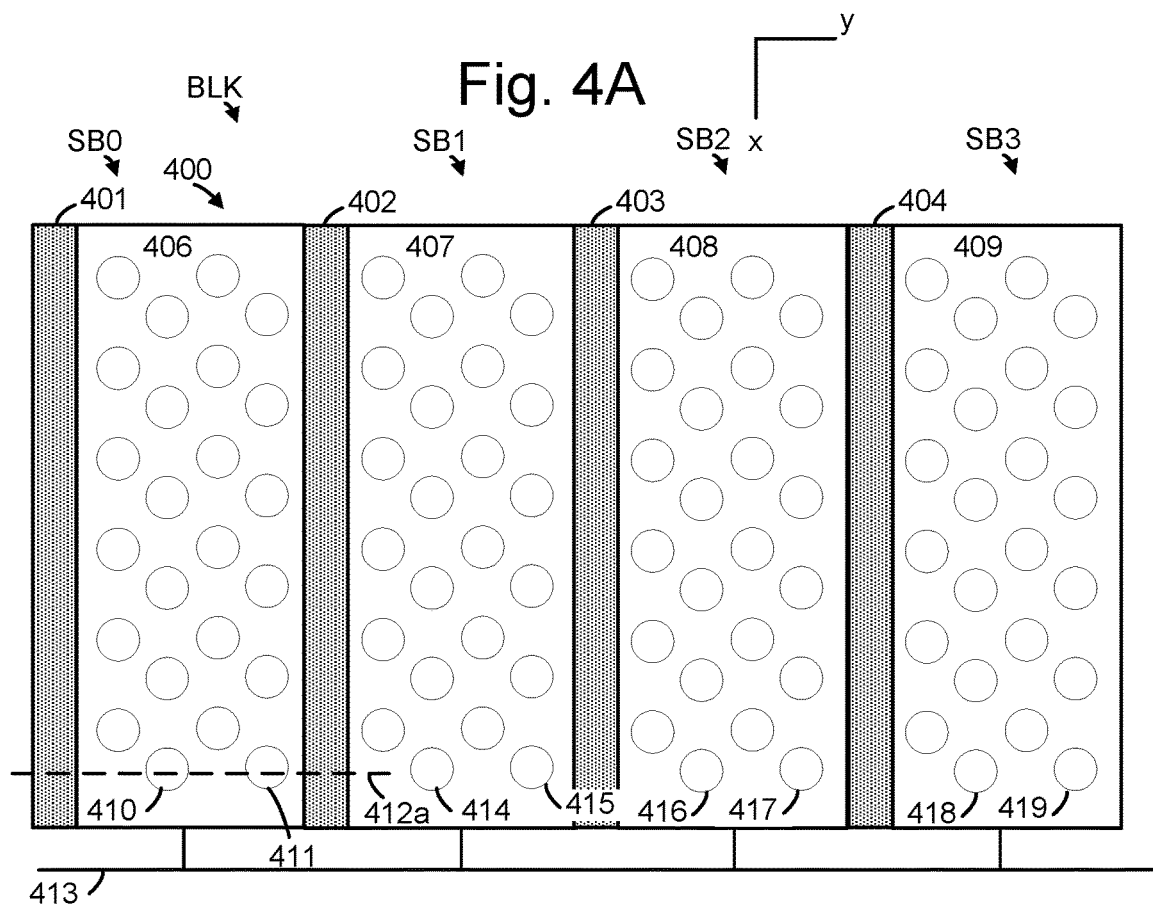
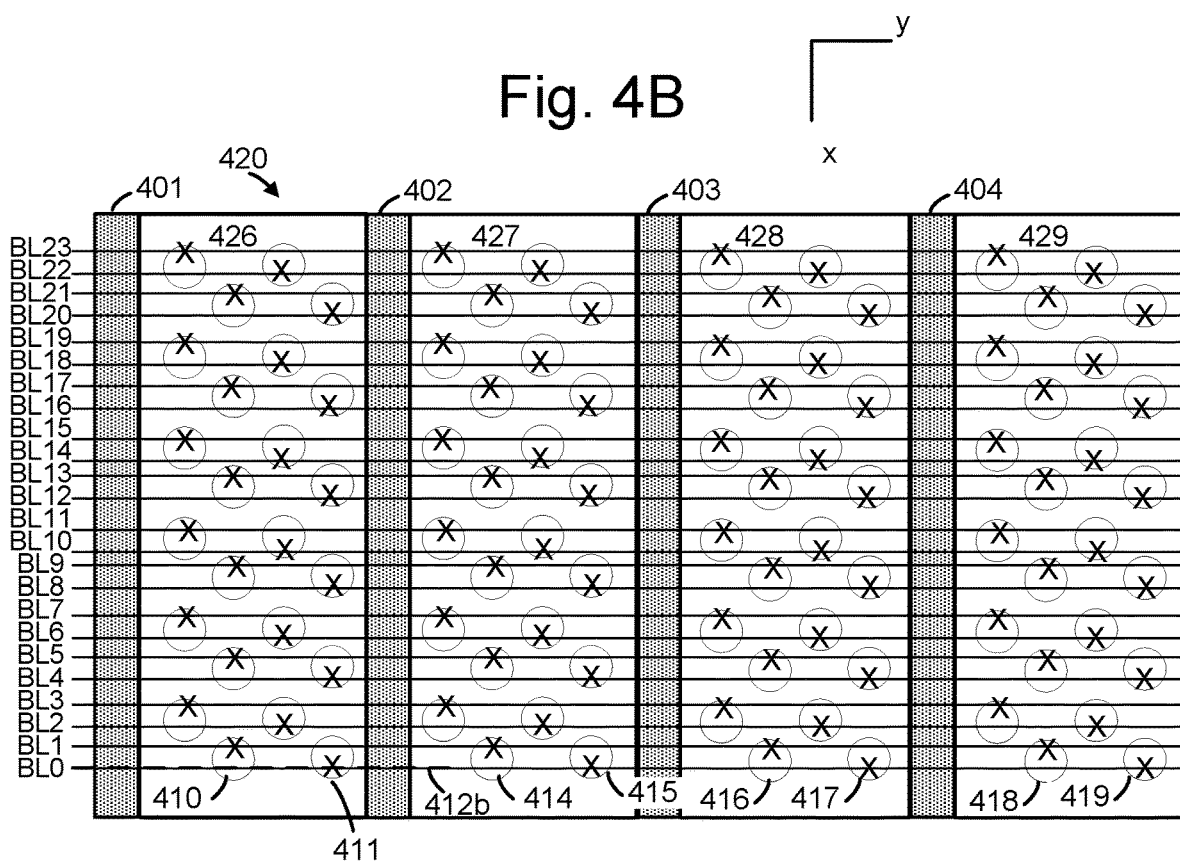

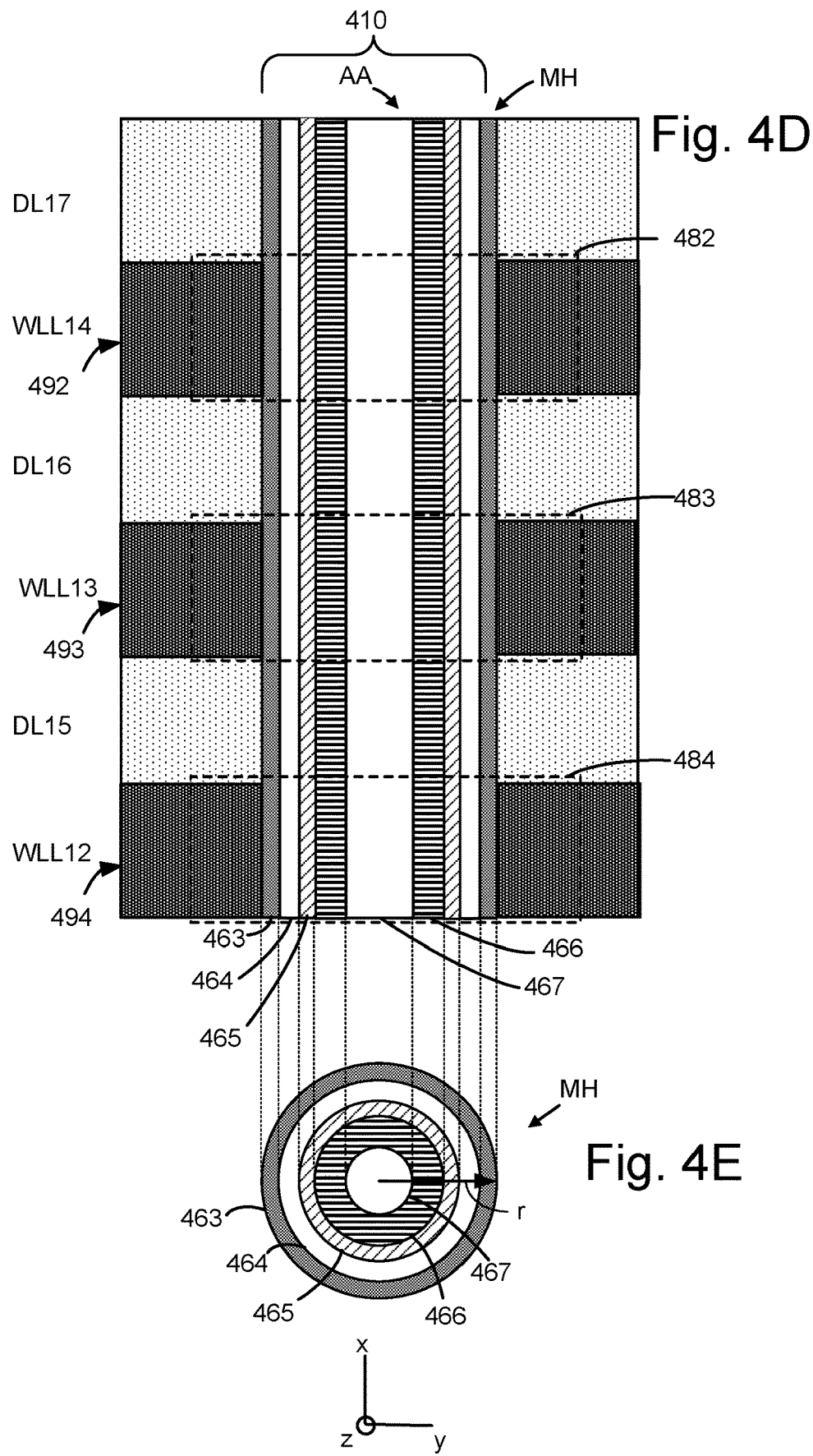

US 11,398,285 B2

MEMORY CELL MIS-SHAPE MITIGATION

CLAIM OF PRIORITY

This application is a continuation application of U.S. patent application Ser. No. 16/414,577, entitled "MEMORY CELL MIS-SHAPE MITIGATION," filed May 16, 2019, published as US 2020/0365217 on Nov. 19, 2020 and issued as U.S. Pat. No. 10,910,076 on Feb. 2, 2021 and incorporated herein by reference in its entirety.

BACKGROUND

The present technology relates to the operation of memory devices.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

In a three-dimensional (3D) memory structure, the memory cells may be arranged in vertical strings in a stack, where the stack comprises alternating conductive and dielectric layers. The conductive layers act as word lines which are connected to the memory cells. Strings of memory cells may be formed by drilling memory holes through a stack of alternating silicon oxide and sacrificial layers, replacing the sacrificial layers with the conductive layers, and filling the memory holes with annular films of memory cell materials. The conductive layers serve as both the word lines, as well as control gates of the memory cells. The annular films may include a blocking layer adjacent to the control gate, a charge storage region, a tunnel dielectric, and a channel (or body).

In some techniques, prior to programming a group of memory cells, the group is erased to what is referred to as an erase state. Then, some of the memory cells are programmed from the erase state to one or more programmed states. Some of the memory cells may remain in the erase state after programming. In some programming techniques, each memory cell is in one of two states after programming, which may be referred to as a single level cell ("SLC"). In some programming techniques, each memory cell is in one of four or more states after programming, which may be referred to as a multi-level cell ("MLC"). Some memory cells have a programmable threshold voltage (Vt). The erase state and the one or more programmed states may be defined in terms of the memory cell threshold voltage.

During programming, a programming voltage may be applied to a word line ("selected word line") that is connected to memory cells that are selected for programming. The threshold voltages of the memory cells are then tested at an appropriate verify voltage for the state to which each memory cells is being programmed. After the verify stage, another programming voltage may be applied to the selected word line. In some techniques, the magnitude of the program voltage is increased after each verify stage. Memory cells that have passed verify may be locked out from further programming.

Some of the memory cells ("unselected memory cells") that are connected to the selected word line may need to be inhibited from programming. In some techniques, boosting voltages are applied to word lines ("unselected word lines") for which no memory cell is to receive programming. The boosting voltages help to raise the channel potential of such unselected memory cells that are to be inhibited from programming, thereby preventing undesired programming of the unselected memory cells.

BRIEF DESCRIPTION OF THE DRAWINGS

Like-numbered elements refer to common components in the different figures.

FIG. 4A depicts a top view of an example word line layer of a 3D memory structure, in one embodiment.

FIG. 4B depicts a top view of an example SGD layer, consistent with FIG. 4A

FIG. 4D depicts a view of the region 423 of FIG. 4C.

FIG. 4E depicts a cross section (in an x-y plane) of memory hole 410 of FIG. 4D.

DETAILED DESCRIPTION

Figure 1:
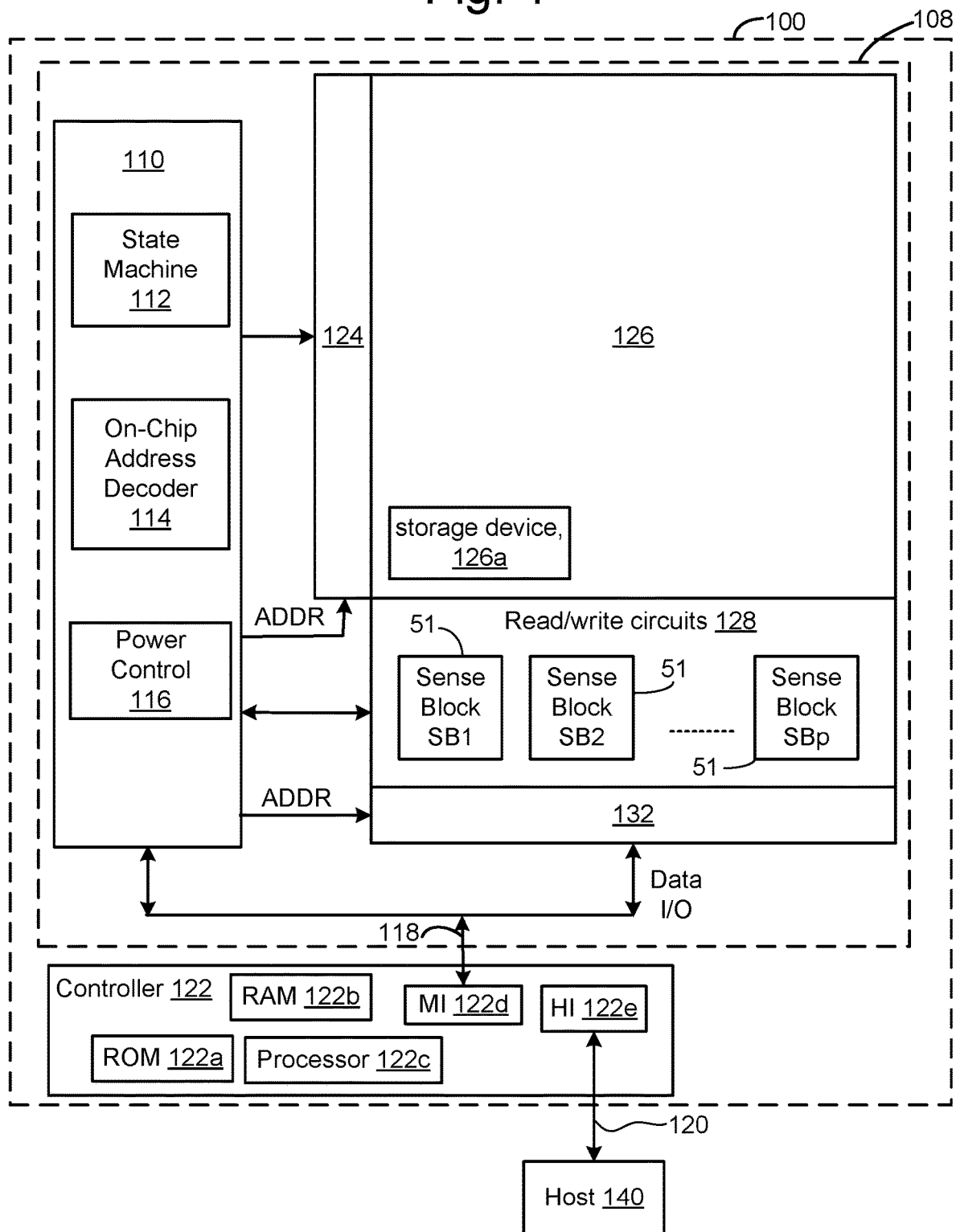
FIG. 1 is a functional block diagram of a memory device.

Techniques are provided for mitigation of mis-shaped non-volatile memory cells. The mis-shape may negatively impact performance of the memory cell. For example, the mis-shape may cause memory cells that should remain in an erase state to be in another state immediately after programming. As will be discussed in more detail below, a possible cause of this problem is the nature of the electric field in a memory cell that resides in a mis-shaped memory hole.

In some embodiments, mis-shape of memory cells that reside in memory holes is mitigated. A memory hole is any opening that is formed during a semiconductor fabrication process, and in which a memory cell, or a portion of memory cell, is formed. In some embodiments, the memory holes are formed by drilling memory holes through a stack of alternating silicon oxide and silicon nitride layers, replacing the silicon nitride layers with the conductive layers, and filling the memory holes with annular films of memory cell materials. The conductive layers serve as both the word lines, as well as control gates of the memory cells. The annular films may include a blocking oxide layer adjacent to the control gate, a charge storage region, a tunnel dielectric, and a channel (or body).

FIG. 4E shows a cross-section of one example of an annular films of a non-volatile memory cell that resides in what is referred to herein as a memory hole (MH). Several annular memory cell films 463-467 are depicted. These films 463-467 may be formed within the memory hole. For example, the non-volatile memory cell can include a blocking oxide/block high-k material 463, charge-trapping layer or film 464 such as SiN or other nitride, a tunneling layer 465, a polysilicon body or channel 466, and a dielectric core 467. The blocking oxide 463 is surrounded by a conductive control gate (not depicted in FIG. 4E), in some embodiments.

Due to limitations of the fabrication process, the memory hole may be mis-shaped. FIG. 5 shows a cross-section of another example of annular films of a non-volatile memory cell that resides in a mis-shaped memory hole. Due to the irregular shape of the memory hole, the annular films 463-467 also have irregular shapes. As noted above, the annular films may be surrounded by a conductive control gate. The conductive control gate is not depicted in FIG. 5, but it will be understood that the conductive control gate will have the irregular shape at the border of film 463. The irregular shape of the memory hole impacts the strength of the electric field in the memory cell. For example, during memory cell operation, when voltages are applied to the control gate, the electric field may be stronger where the control gate shape is more pointed and weaker where the control gate shape is straighter. In contrast, during memory cell operation, the electric field will be more uniform for the example memory hole of FIG. 4E. One possible consequence of the memory hole mis-shape in FIG. 5, is that boosting voltages (which are applied to the control gate) that are intended to prevent undesired programming of unselected memory cells (connected to the selected word line) may not be effective enough to prevent undesired programming. A possible impact is for memory cells that should remain in the erase state to be in a programmed state (e.g., A-state) immediately after programming.

In some embodiments, one or more program parameters during programming of a group of non-volatile memory cells is/are selected based on a severity of a memory hole mis-shape in the group. The one or more program parameters may include, but are not limited to: 1) the program voltage step size between program loops; 2) a voltage gap between an erase-state verify reference voltage and an A-state verify reference voltage; 3) one or more verify reference levels that are used to verify whether a memory cell has been programmed to its target state; and/or 4) a voltage gap between a first verify reference voltage for a lowest programmed state and a second verify reference voltage for a highest programmed state.

Note that rather than attempting to characterize the severity of mis-shape of each memory hole, the severity of the memory hole mis-shape of a group of memory cells is determined, in some embodiments. There may be considerable variance in the severity of mis-shape within the group. Some memory holes in the group may be well-formed (such as the example of FIG. 4E), other memory holes in the group may be quite irregular (such as the example of FIG. 5), other memory holes in the group may have an irregularity between the example of FIGS. 4E and 5, still others could be even more irregular than the example in FIG. 5. In some embodiments, the severity of the memory hole mis-shape in the group is based on a number memory cells having a threshold voltage in a zone between an erase-state verify voltage and an A-state verify voltage immediately after programming the group. Note that this zone need not occupy the entire region between the erase-state verify reference voltage and the A-state verify reference voltage. For example, the zone could be between a reference voltage used to read the A-state and the A-state verify reference voltage.

The foregoing may be used to tailor the program parameters to the severity of the mis-shape of a group of the memory cells. In the event that the memory holes for a group of memory cells are severely mis-shaped, then one or more program parameters may be selected to deal with one or more issues that arise due to the mis-shape. Note that some (even many) of the memory holes in the group could be well-formed. In one embodiment, the margin between an erase-state verify voltage and an A-state verify level is increased in response to the memory hole mis-shape in a group being above a threshold. In one embodiment, a smaller program step size is used in response to the severity of the memory hole mis-shape being above a threshold. In one embodiment, both a smaller program step size and an increased A-state verify level is used in response to the severity of the memory hole mis-shape being above a threshold. Using this set of program parameters can allow a group of memory cells (e.g., die, plane, block) that might otherwise by unsuitable for use to be used.

In the event that the severity of the mis-shape of the memory holes for a group of memory cells is low, then the program parameters can be adjusted to, for example, increase the performance level relative to default values. Note that a few of the memory holes in the group could be somewhat irregular or even severely irregular (as in the example of FIG. 5). In one embodiment, the performance level for a group of memory cells is increased (relative to a default performance level) in response to determining that the severity of a memory hole mis-shape is below a threshold. In one embodiment, a larger program step size (relative to a default program step size) is used in response to the severity of the memory hole mis-shape being below a threshold. Using a larger program step size can improve performance by reducing programming time. In one embodiment, the margin between an erase-state verify reference voltage and an A-state verify reference level is decreased (relative to a default A-state verify reference level) in response to the memory hole mis-shape in a group being below a threshold, which may allow for greater margins between other programmed states. In one embodiment, both a larger program step size and a decreased A-state verify level is used in response to the severity of the memory hole mis-shape being below a threshold. Thus, performance may be improved relative to default performance levels.

FIG. 1-FIG. 4E describe one example of a memory system that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The read/write/erase circuits 128 include multiple sense blocks 51 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase and others) on memory structure 126, and includes state machine 112, an on-chip address decoder 114, and a power control circuit 116. In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered one or more control circuits that perform the functions described herein. The one or more control circuits can include hardware only or a combination of hardware and software (including firmware). For example, a controller programmed by firmware to perform the functions described herein is one example of a control circuit. One or more control circuits can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126 for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

Figure 2:
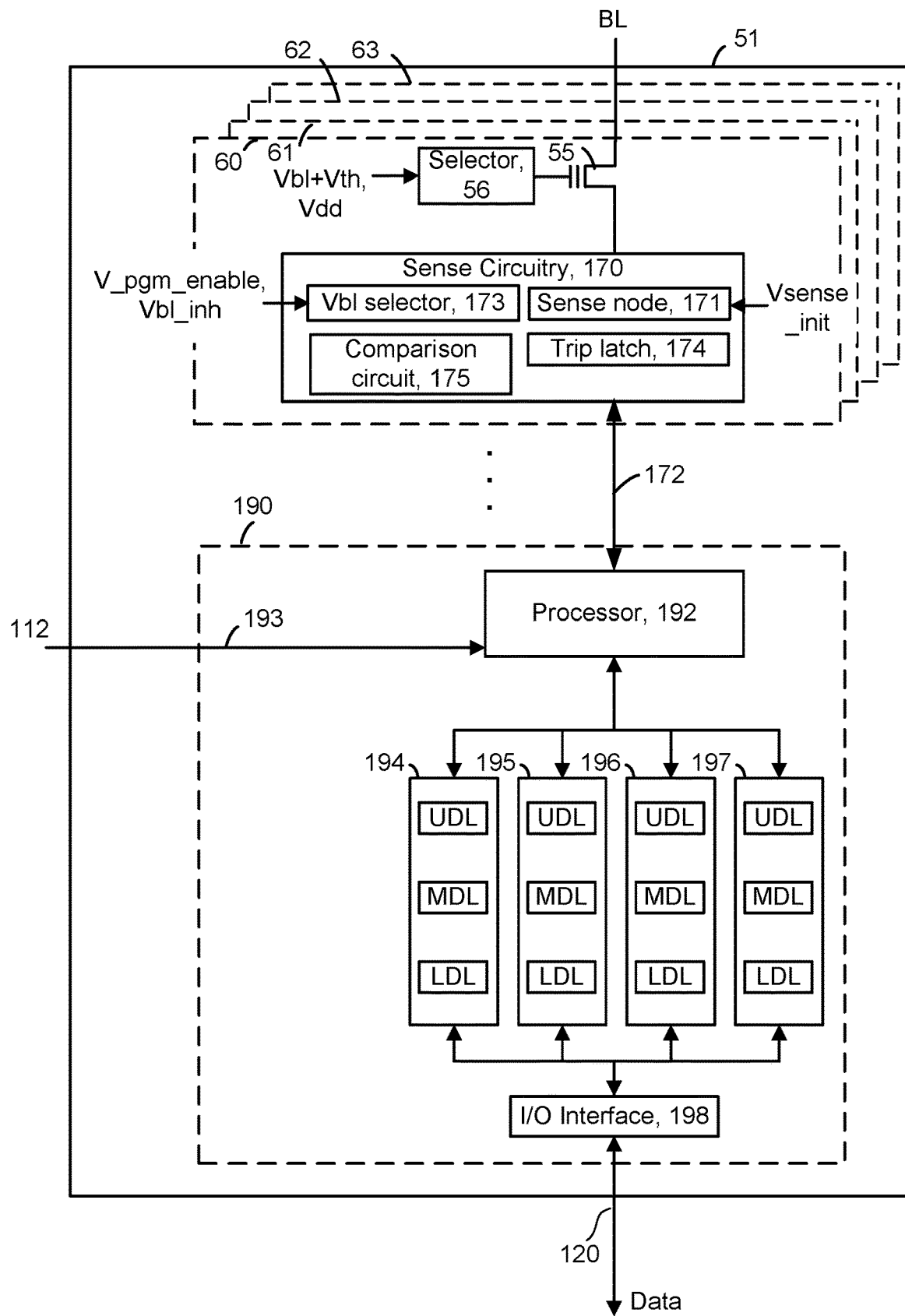
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass a program enable voltage (e.g., V_pgm_enable) or a program-inhibit voltage (e.g., Vbl_inh) to a bit line connected to a memory cell. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

The sense circuit 60 is configured to control the timing of when the voltages are applied to the bit line. The sense circuit 60 is configured to control the length of time that the QPW voltage is applied to the bit line, in one embodiment. In one embodiment, the length of time that a weak program enable voltage is applied to the BL during predictive programming depends on the non-CP state (to which the memory cell associated with the BL is being programmed). In one embodiment, the lengths of time that both a full program enable and a weak program enable voltage are applied to the BL during predictive programming depends on the non-CP state (to which the memory cell associated with the BL is being programmed).

During sensing operations such as read and verify operations, the bit line voltage is set by the transistor 55 based on the voltage passed by the selector 56. The bit line voltage is roughly equal to the control gate voltage of the transistor minus its Vt (e.g., 1 V). For example, if Vbl+Vt is passed by the selector 56, the bit line voltage will be Vbl. This assumes the source line is at 0 V. The transistor 55 clamps the bit line voltage according to the control gate voltage and acts as a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 198 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a middle page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 198 provides an interface between data latches 194-197 and the data bus 120.

The processor 192 may also be used to determine what voltage to apply to the bit line, based on the state of the latches. This may be used to manage the magnitude and/or length of time that a weak program enable voltage is applied to the bit line.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
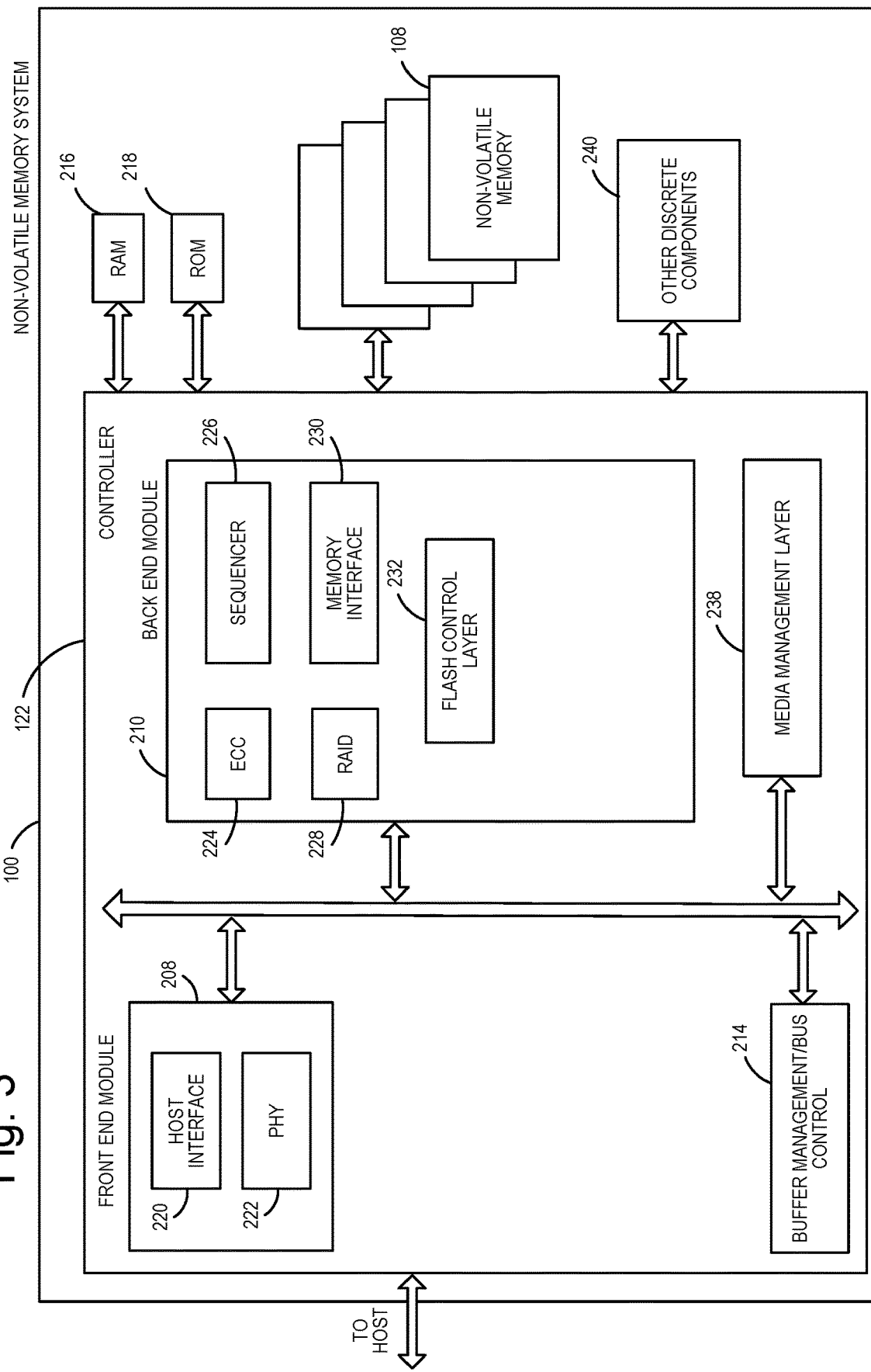
FIG. 3 is a block diagram depicting one embodiment of a memory system.

FIG. 3 is a block diagram of example memory system 100, depicting more details of one embodiment of controller 122. The controller in FIG. 3 is a flash memory controller, but note that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

The memory cells on a memory die 108 can be arranged in one or more planes. In one embodiment, memory operations are performed in parallel on groups of memory cells on different planes on the same memory die. In one embodiment, memory operations are performed in parallel on groups of memory cells on different memory die 108.

As depicted in FIG. 3, controller 122 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 108 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230, which is configured to be connected to non-volatile memory 108, provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block (or a tier within a block in some embodiments). The MML 238 understands these potential limitations of the memory 126 which may not be visible to the host. Accordingly, the MML 238 attempts to translate the writes from host into writes into the memory 126.

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

One or more of ECC 224, sequencer 226, RAID 228, flash control layer 232, media management layer 238, and/or buffer management/bus control 214 may be referred to as a processor circuit. The processor circuit can include hardware only or a combination of hardware and software (including firmware). For example, a controller programmed by firmware to perform the functions described herein is one example of a control circuit. A processor circuit can include a processor, PGA (Programmable Gate Array, FPGA (Field Programmable Gate Array), ASIC (Application Specific Integrated Circuit), integrated circuit or other type of circuit.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 4:
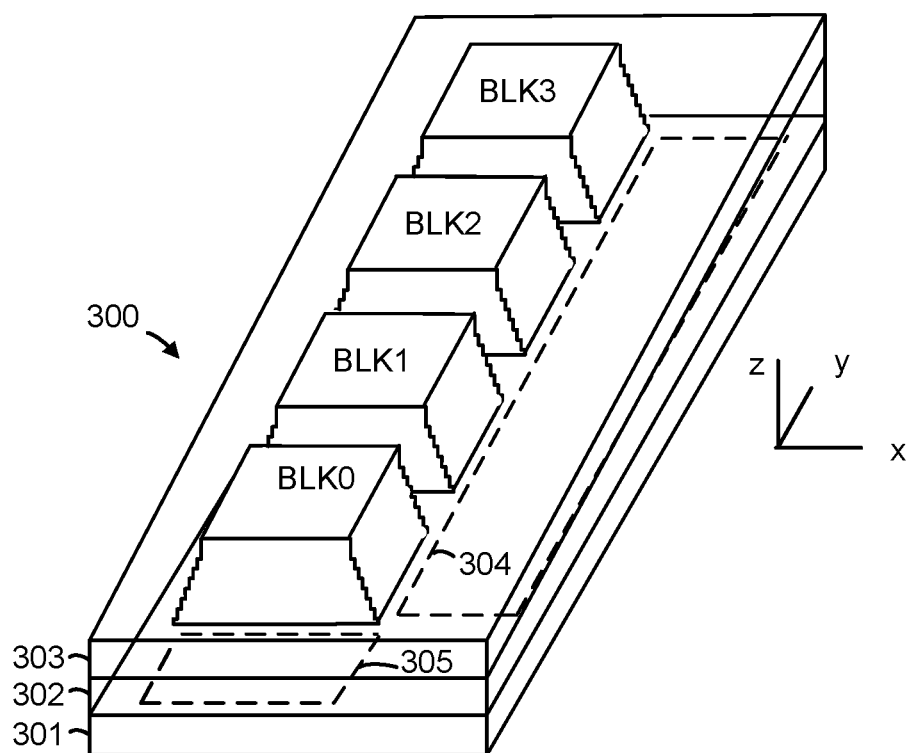
FIG. 4 is a perspective view of a memory device.
Figure 5:
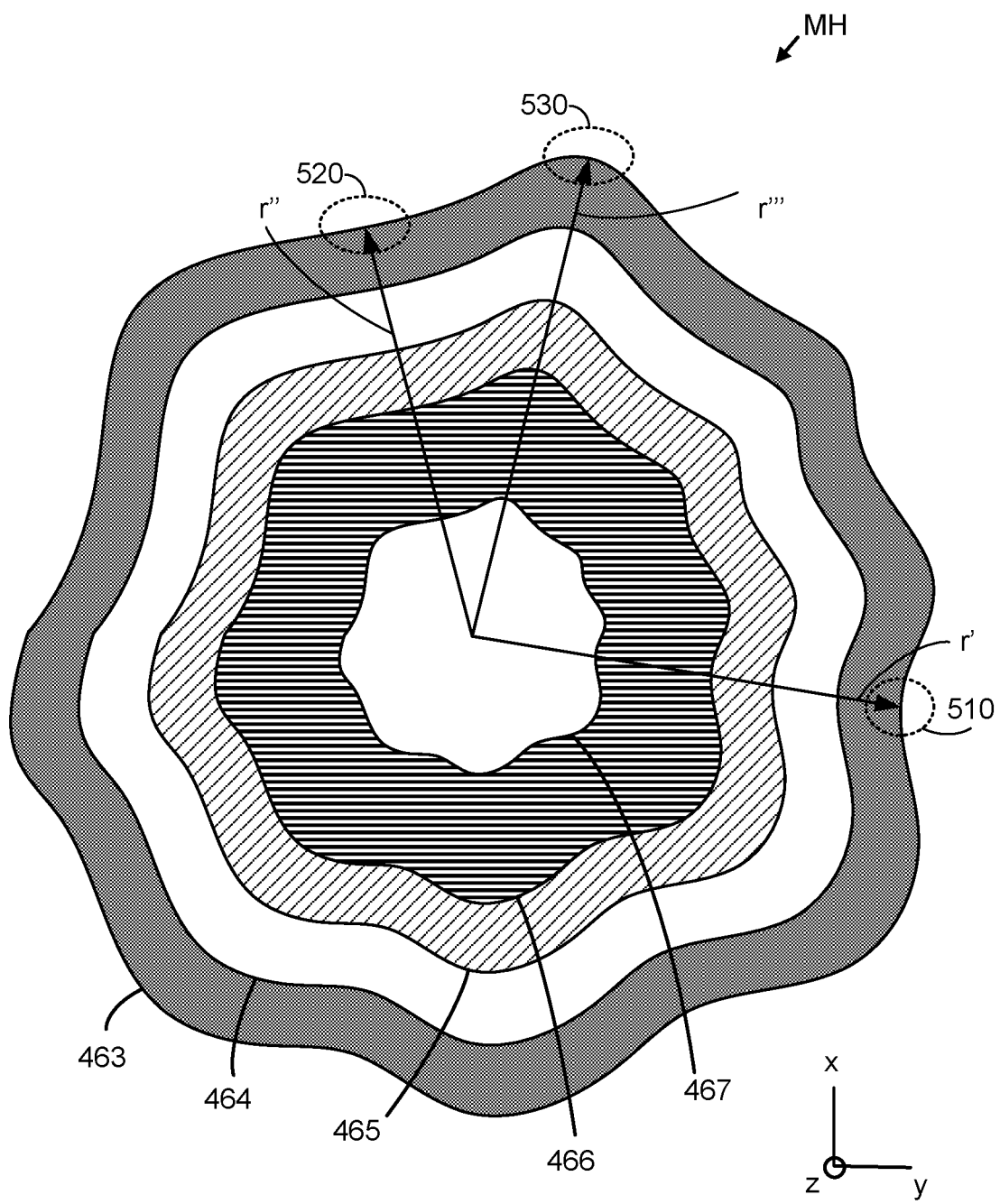
FIG. 5 is a cross-sectional view of an example of a memory hole that is severely mis-shaped.

FIG. 4 is a perspective view of a memory device 300 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The substrate has a major surface that extends in the x-y plane. The blocks may be formed over the major surface. The peripheral area 304 runs along an edge of each block while the peripheral area 305 is at an end of the set of blocks. Each peripheral area can include circuitry, including but not limited to voltage drivers which can be connected to control gate layers, bit lines and source lines of the blocks.

The substrate 301 can also carry circuitry under the blocks, along with one or more lower metal layers which are patterned in conductive paths to carry signals of the circuitry. The blocks are formed in an intermediate region 302 of the memory device. In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 4A depicts a top view of an example word line layer 400 of a 3D memory structure, in one embodiment. A 3D memory device can comprise a stack of alternating conductive and dielectric layers. Herein, the layers may be referred to as horizontal layers, due to their orientation with respect to the x-y surface of the substrate 301. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. In addition to the charge-trapping material and channel material, other material such as tunnel dielectric material may be formed in the memory holes. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

The word line layer is divided into regions 406, 407, 408 and 409 which are each connected by a connector 413. Metal-filled slits 401, 402, 403 and 404 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device.

The last region of a word line layer in a block can be connected to a first region of a word line layer in a next block, in one approach. The connector, in turn, is connected to a voltage driver for the word line layer. In this example, there are four rows of memory holes between adjacent slits. A row here is a group of memory holes which are aligned in the x-direction. Moreover, the rows of memory holes are in a staggered pattern to increase the density of the memory holes. The region 406 has example memory holes 410 and 411 along a line 412a. The region 407 has example memory holes 414 and 415. The region 408 has example memory holes 416 and 417. The region 409 has example memory holes 418 and 419.

Each circle represents the cross-section of a memory hole at a word line layer or SG layer. Each circle can alternatively represent a memory cell which is provided by the materials in the memory hole and by the adjacent word line layer. Note that the term memory hole, as used herein, may be used both to refer to an empty region that is formed from, for example, etching, as well as to that region after it is filled with memory cell films.

FIG. 4A and other Figures are not necessarily to scale. In practice, the regions can be much longer in the x-direction relative to the y-direction than is depicted to accommodate additional memory holes.

FIG. 4B depicts a top view of an example SGD layer 420, consistent with FIG. 4A. The SGD layer is divided into regions 426, 427, 428 and 429. Each region can be connected to a different voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region 426 has the example memory holes 410 and 411 along a line 412b which is coincident with a bit line BL0. The region 427 also has the example memory hole 414 which is coincident with a bit line BL1. A number of bit lines extend above the memory holes and are connected to the memory holes as indicated by the "X" symbols. BL0 is connected to a set of memory holes which includes the memory holes 411, 415, 417 and 419. Another example bit line BL1 is connected to a set of memory holes which includes the memory holes 410, 414, 416 and 418. The metal-filled slits 401, 402, 403 and 404 from FIG. 4A are also depicted, as they extend vertically through the stack. The bit lines can be numbered in a sequence BL0-BL23 across the SGD layer 420 in the x-direction. In practice many more bit lines can be used for SGD layer 420.

Different subsets of bit lines are connected to cells in different rows. For example, BL0, BL4, BL8, BL12, BL16 and BL20 are connected to cells in a first row of cells at the right-hand edge of each region. BL2, BL6, BL10, BL14, BL18 and BL22 are connected to cells in an adjacent row of cells, adjacent to the first row at the right-hand edge. BL3, BL7, BL11, BL15, BL19 and BL23 are connected to cells in a first row of cells at the left-hand edge of each region. BL1, BL5, BL9, BL13, BL17 and BL21 are connected to cells in an adjacent row of cells, adjacent to the first row at the left-hand edge.

The memory holes in FIGS. 4A and 4B are depicted as being circular in x-y cross section. As noted above, the memory holes may have an irregular shape (such as, for example, the irregular shape depicted in FIG. 5). Techniques are disclosed herein to characterize the severity of the memory hole mis-shape of a group, such as the memory holes at a word line layer in a block. One or more program parameters for programming that group may be selected based on the severity of the memory hole mis-shape of a group. Those selected program parameters could be applied to other groups without the need to perform a measurement directly on that group. For example, after performing a measurement to characterize the severity of the memory hole mis-shape at a word line of a block, it may be assumed that other word lines in the same block have about the same severity of memory hole mis-shape. On the other hand, due to the nature of the fabrication process, the severity of memory hole mis-shape could depend on the layer in the block.

Figure 4C:
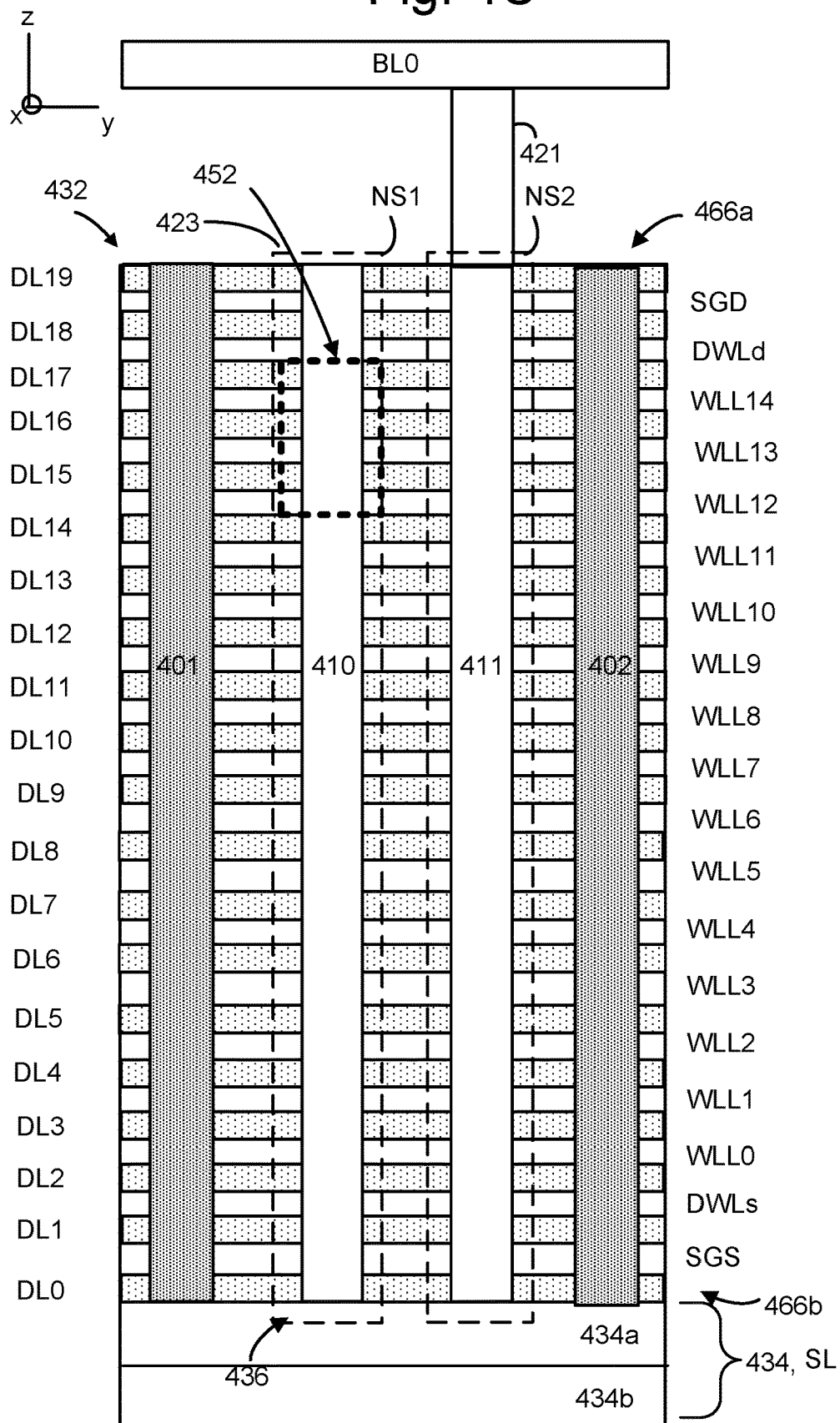
FIG. 4C depicts an example cross-sectional view of a portion of one of the blocks of FIG. 4.

FIG. 4C depicts an example cross-sectional view of a portion of one of the blocks of FIG. 4. The cross-sectional view is consistent with line 412a of FIG. 4A, as well as line 412b of FIG. 4B. The block comprises a stack 432 of alternating conductive and dielectric layers. In this example, the conductive layers comprise SGD layer, SGS layer, dummy word line layers (or word lines) DWLd, DWLs, in addition to data word line layers (or word lines) WLL0-WLL14. The dielectric layers are labelled as DL0-DL19. Further, regions of the stack which comprise NAND strings NS1 and NS2 are depicted. Each NAND string encompasses a memory hole 410 or 411 which is filled with materials which form memory cells adjacent to the word lines. A region 423 of the stack is shown in greater detail in FIG. 4D. Note that there may be more or fewer SGD layers, SGS layers, dummy word line layers, and data word line layers.

Underneath the stack is a source line (SL) 434. In one approach, a portion of the source line SL comprises a polysilicon layer 434a which is in contact with a source end of each string of memory cells in a block. The polysilicon layer 434a is in electrical contact with the NAND string channel (not shown in FIG. 4C). The polysilicon layer 434a is in contact with a metal 434b (e.g., tungsten) layer. The source line 434 may be shared by all of the blocks in a plane, in one approach.

NS1 has a source-end 436 at a bottom 466b of the stack 432 and a drain-end 452 at a top 466a of the stack. Metal-filled slits 401, 402 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 421 connects the drain-end 452 of NS2 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

FIG. 4D depicts a view of the region 423 of FIG. 4C. FIG. 4E depicts a cross section (in an x-y plane) of memory hole 410 of FIG. 4D. Region 423 contains several memory cells 482, 483, 484. The memory hole 410 includes a number of memory cell films 463-467. For example, each column (e.g., the pillar which is formed by the materials within a memory hole) can include a blocking oxide/block high-k material 463, charge-trapping layer or film 464 such as SiN or other nitride, a tunneling layer 465, a polysilicon body or channel 466, and a dielectric core 467. A word line layer can include a conductive metal such as Tungsten as a control gate. For example, control gates 492, 493 and 494 are provided. In this example, all of the layers except the metal are provided in the memory hole. In other approaches, some of the memory film layers can be in the control gate layer. Thus, the memory hole 410 could contain fewer (or more) memory film layers than are shown in FIGS. 4D and 4E. Also note that some of the depicted layers may be formed from one or more layers. Additional pillars are similarly formed in the different memory holes. A pillar can form a columnar active area (AA) of a NAND string.

When a memory cell transistor is programmed, electrons are stored in a portion of the charge-trapping layer 464 which is associated with the memory cell transistor. These electrons are drawn into the charge-trapping layer from the channel 466, and through the tunneling layer 465. The Vt of a memory cell transistor is increased in proportion to the amount of stored charge. During an erase operation, the electrons return to the channel. Non-data transistors (e.g., select transistors, dummy memory cell transistors) may also include the charge trapping layer 464. Thus, the threshold voltage of at least some non-data transistors may also be adjusted by storing or removing electrons from the charge trapping layer 464. It is not required that all non-data transistors have an adjustable Vt. For example, the charge trapping layer 464 is not required to be present in every select transistor.

In some embodiments, the memory hole is formed by drilling (or etching) holes into a stack of alternating layers (e.g., alternating layers of a conductive material and a sacrificial material). The memory cell films may be deposited on the sidewall of the memory hole. For example, first the blocking layer 463 may be deposited on the memory hole sidewall using atomic layer deposition, or another deposition technique. Then, then charge trapping layer 464 may be deposited over the blocking layer 463. Next, the tunneling layer 465 may be deposited over the charge trapping layer 464. In some cases, the tunneling layer 465 can comprise multiple layers such as in an oxide-nitride-oxide configuration. Then, the body 466 may be deposited over the tunneling layer 465. Then, the dielectric core 467 may be formed within the body 466. Other techniques may be used to form the memory cell film. As noted above, the term "memory hole" may be used to refer to both the empty region that exists after drilling (or etching) holes into the stack or to the region after it has been filled with the memory cell film.

In the example of FIG. 4E, each of the films 463-467 comprises an annular ring. The films represent an example of a well-formed memory hole, which is not mis-shaped. The memory hole in which the films 463-467 were formed has a circular cross sectional shape with a radius of "r". During operation, voltages are applied to the word lines, as well as other regions. One example is to apply a program voltage to a selected word line and boosting voltages to unselected word lines. The boosting voltages help to prevent undesired programming of memory cells that are not presently selected for programming. The shape of the interface between the word line and the memory cells films 463-467 impacts the nature of the electric field in that region. Therefore, the nature of the word line voltage can be impacted by the shape of the memory hole.

The memory hole will not be perfectly circular in all cases. The amount of mis-shape from a perfect circle may vary considerably from one memory hole to the next. FIG. 5 is a cross-sectional view of an example of a memory hole that is severely mis-shaped. The memory hole has an irregular shape. The shape may be described as an irregular circle. The irregular circle is referred to herein as "memory hole striation." The memory hole in FIG. 4E has no memory hole striation. A number of lines labeled r', r", and r'" are depicted in FIG. 5. Each line extends from a common point that is defined as the center of the memory hole to the outside of film 463. Note that the outside of film 463 is defined as the boundary of the memory hole in this example, but as noted, the memory hole can be filled with other types of films. The lines r', r", and r'" may differ in length. In other words, the boundary of the memory hole is not circular in shape, but has an irregular shape. Moreover, the irregular shape has different curvatures in different regions (several regions 510, 520, 530 are indicated by dashed circles). The irregular shape of the memory hole has regions which have relatively sharp corners. For example, region 530 has a relatively sharp corner. The irregular shape of the memory hole has regions which have relatively flat shapes. For example, region 510 has a relatively flat shape. The shape of the memory hole impacts the nature of the electric field. Therefore, voltages applied to the word line may be impacted by the irregular shape of the memory hole. For example, the electric field may be stronger where the memory hole shape is more pointed and weaker where the memory hole shape is straighter. For example, during memory cell operation, when voltages are applied to the control gate, the electric field may be stronger where the control gate shape is more pointed and weaker where the control gate shape is straighter. In contrast, the electric field will be more uniform for the example of FIG. 4E.

One possible consequence of the memory hole mis-shape in FIG. 5, is that boosting voltages (which are applied to the control gate) that are intended to prevent undesired programming of unselected memory cells (connected to the selected word line) may not be effective enough to prevent undesired programming. A possible impact is for memory cells that should remain in the erase state to be in a programmed state (e.g., A-state) immediately after programming. Another possible consequence of the memory hole mis-shape in FIG. 5 is that the programming slope can be lower. The programming slope refers to the impact that an increase in the program voltage has on the change in memory cell Vt.

Figure 6:
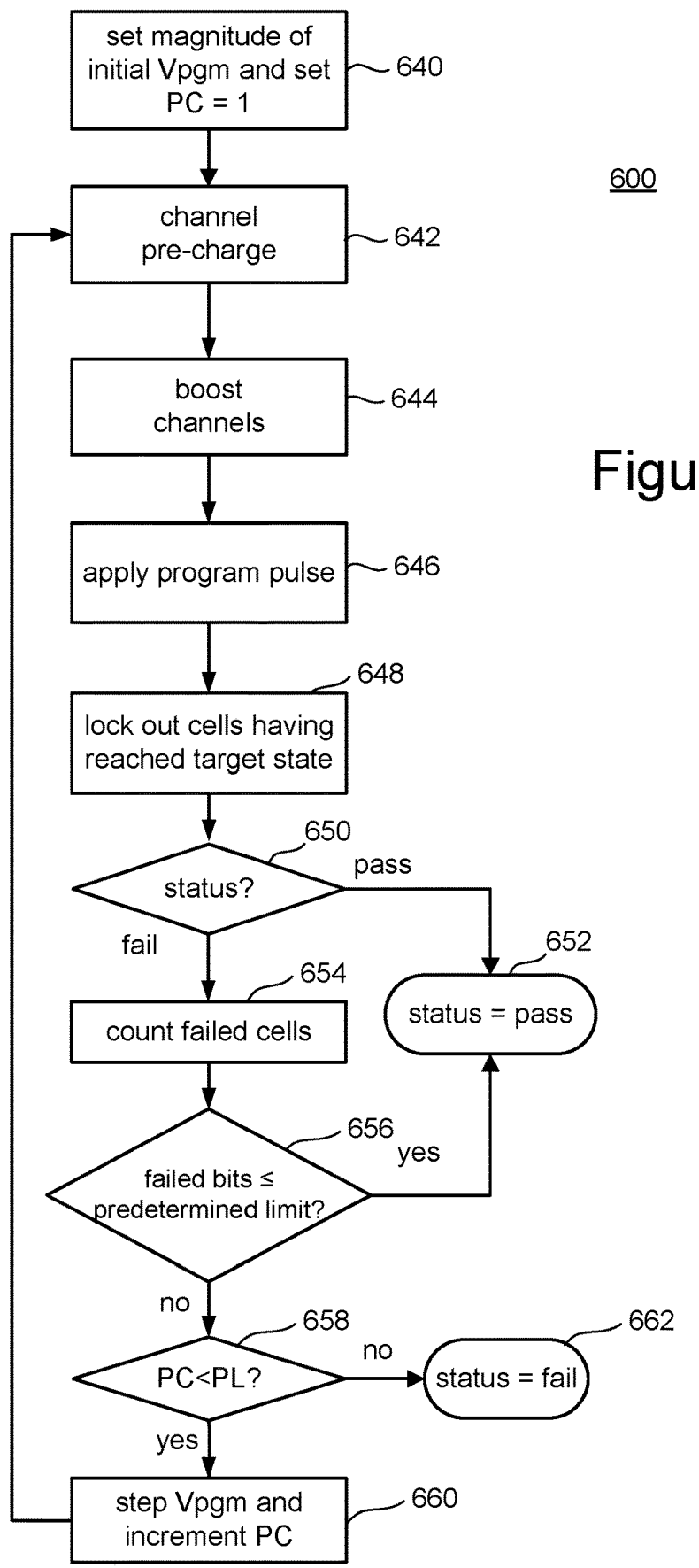
FIG. 6 is a flowchart describing one embodiment of a process for programming NAND strings of memory cells organized into an array.

FIG. 6 is a flowchart describing one embodiment of a process 600 for programming NAND strings of memory cells organized into an array. In one example embodiment, the process of FIG. 6 is performed on memory die 108 using the control circuit discussed above. For example, the process of FIG. 6 can be performed at the direction of state machine 112.

Typically, the program voltage applied to the control gates (via a selected word line) during a program operation is applied as a series of program pulses. Between at least some of the programming pulses are a set of verify pulses to perform verification. In many implementations, the magnitude of the program pulses is increased with each successive pulse by a predetermined step size. The size of the step varies depending on a level of severity of memory cell mis-shape, in some embodiments. In step 640 of FIG. 6, the programming voltage (Vpgm) is initialized to the starting magnitude (e.g., ~12-16V or another suitable level) and a program counter PC maintained by state machine 112 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with state S0 (see FIG. 6) so they will not be programmed. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 642 the memory system will pre-charge channels of NAND strings that include memory cells connected to the selected word line that are to be inhibited from programming. In some embodiments, the channel is pre-charged from the drain end of the NAND string. By "drain end" it is meant the end of the NAND string connected to the bit line. In some embodiments, the channel is pre-charged from the source end. By "source end" it is meant the end of the NAND string connected to the source line. In some embodiments, the channel is pre-charged from both the drain end and the source end.

In step 644, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string. This allows the boosting voltages to boost the potential of the NAND channel.

In step 646, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string." In step 646, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 648, memory cells that have reached their target states are locked out from further programming. Step 648 may include performing verifying at one or more verify reference levels. In one embodiment, the verification process is performed by testing whether the threshold voltages of the memory cells selected for programming have reached the appropriate verify reference voltage. The verify reference voltage is at a lower tail of the target state, in one embodiment. As used herein "lower tail" refers to a portion of distribution between its lowest threshold voltage level and the threshold voltage level at the apex of the distribution. Similarly, as used herein "upper tail" refers to a portion of distribution between its highest threshold voltage level and the threshold voltage level at the apex of the distribution.

In step 648, a memory cell may be locked out after the memory cell has been verified (by a test of the Vt) that the memory cell has reached its target state.

If, in step 650, it is determined that all of the memory cells have reached their target threshold voltages (pass), the programming process is complete and successful because all selected memory cells were programmed and verified to their target states. A status of "PASS" is reported in step 652. Otherwise if, in 650, it is determined that not all of the memory cells have reached their target threshold voltages (fail), then the programming process continues to step 654.

In step 654, the memory system counts the number of memory cells that have not yet reached their respective target threshold voltage distribution. That is, the system counts the number of memory cells that have, so far, failed to reach their target state. This counting can be done by the state machine, the controller 122, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 656, it is determined whether the count from step 654 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 652. In this situation, enough memory cells programmed correctly such that the few remaining memory cells that have not been completely programmed can be corrected using ECC during the read process. In some embodiments, the predetermined limit used in step 656 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 658 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 662. If the program counter PC is less than the program limit value PL, then the process continues at step 660 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 660, the process loops back to step 642 and another program pulse is applied to the selected word line so that another iteration (steps 642-660) of the programming process of FIG. 6 is performed.

Figure 7A:
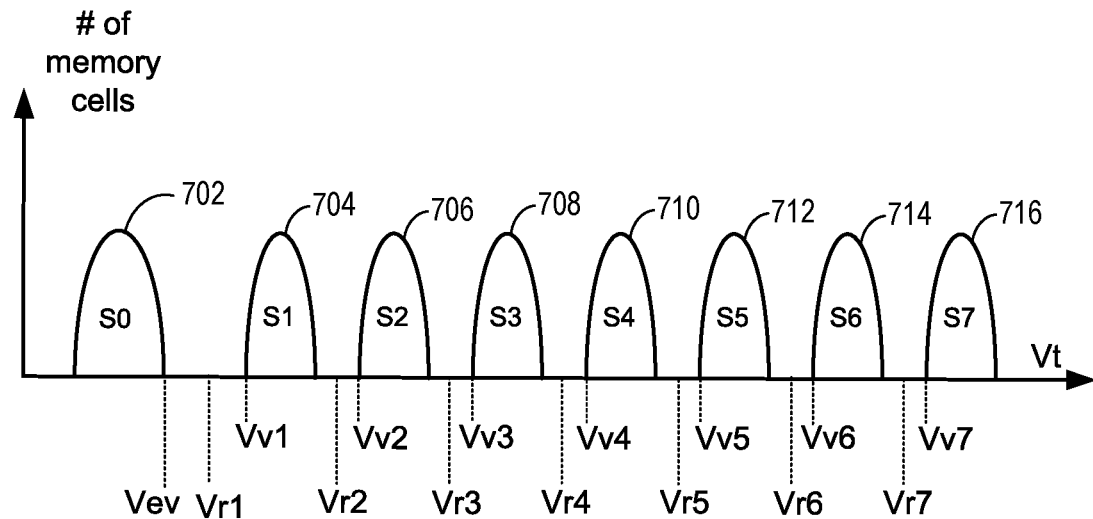
FIG. 7A shows distributions of threshold voltages for programmed memory cells.

At the end of a successful programming process, the threshold voltages of the memory cells should be within one or more distributions of threshold voltages for programmed memory cells or within a distribution of threshold voltages for erased memory cells, as appropriate. FIG. 7A illustrates example threshold voltage distributions for the memory array when each memory cell stores three bits of data. Other embodiments, however, may use other data capacities per memory cell (e.g., such as one, two, four, or five bits of data per memory cell). FIG. 7A shows eight threshold voltage distributions, corresponding to eight data states. The first threshold voltage distribution (data state) S0 represents memory cells that are erased. State S0 may also be referred to herein as an erase state (Er State). The other seven threshold voltage distributions (programmed states) S1-S7 represent memory cells that are programmed and, therefore, are called programmed states. The programmed states may also be referred to by letters. For example, the set of programmed states (A, B, C, D, E, F, and G) may correspond to the set of programmed states (S1, S2, S3, S4, S5, S6, and S7). Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 7A shows eight threshold voltage distributions 702-716. Distribution 702 corresponds to state S0; distribution 704 corresponds to state S1; distribution 706 corresponds to state S2; distribution 708 corresponds to state S3; distribution 710 corresponds to state S4; distribution 712 corresponds to state S5; distribution 714 corresponds to state S6;

and distribution 716 corresponds to state S7. FIG. 7A also shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 7A also shows seven verify reference voltages, Vv1, Vv2, Vv3, Vv4, Vv5, Vv6, and Vv7. In some embodiments, when programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. The programmed state (e.g., S1 or A-state) that is verified by the lowest magnitude reference voltage (e.g., Vv1) is referred to herein as the "lowest programmed state." The programmed state (e.g., S7 or G-state) that is verified by the highest magnitude reference voltage (e.g., Vv7) is referred to herein as the "highest programmed state."

FIG. 7A also shows Vev (for an "erase verify voltage"), which is a voltage level to test whether a memory cell has been properly erased. As depicted in FIG. 7A, a memory cell that is erased should have a Vt below Vev. As will be discussed more fully below, after a programming process, some memory cells that should have a Vt below Vev (i.e., should be in the erased state) may have a Vt above Vev. In some cases, the Vt may be above Vr1 or even above Vv1. Memory cells that are mis-shaped may be more likely to exhibit such behavior. Memory cells that should have remained in the erase state, but have a Vt above a certain voltage (e.g., Vev or Vr1) are referred to herein as "program disturbed erase state cells."

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. In some embodiments, data states S1-S7 can overlap, with controller 122 relying on error correction to identify the correct data being stored.

The technology described herein can also be used with other types of programming in addition to full sequence programming (including, but not limited to, multiple stage/ phase programming). In one embodiment of multiple stage/ phase programming, all memory cells to end up in any of data states S4-S7 are programmed to an intermediate state that is no higher than S4 in a first phase. Memory cells to end up in any of data states S0-S3 do not receive programming in the first phase. In a second phase, memory cells to end up in either data state S2 or S3 are programmed to a state that is no higher than S2; memory cells to end up in either data state S6 or S7 are programmed to a state that is no higher than S6. In at third phase, the memory cells are programmed to their final states. In one embodiment, a first page is programmed in the first phase, a second page is programmed in the second phase, and a third page is programmed in the third phase. Herein, once on page has been programmed into a group of memory cells, the memory cells can be read back to retrieve the page. Hence, the intermediate states associated with multi-phase programming are considered herein to be programmed states.

In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 7A) or verify operation (e.g. see verify target levels Vv1, Vv2, Vv3, Vv4, Vv5, Vv6, and Vv7 of FIG. 7A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 7B:
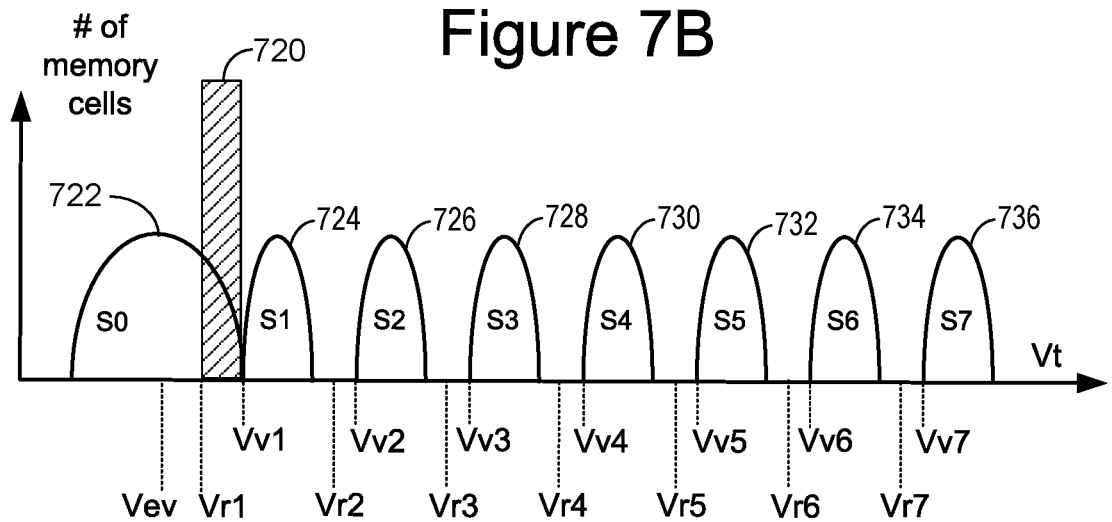
FIG. 7B shows eight possible threshold voltage distributions after programming in order to illustrate a possible problem that may occur with a group of memory cells having severe mis-shape.

FIG. 7B shows eight possible threshold voltage distributions 722-736 after programming in order to illustrate a possible problem that may occur with a group of memory cells having severe mis-shape. Distribution 722 corresponds to state S0; distribution 724 corresponds to state S1; distribution 726 corresponds to state S2; distribution 728 corresponds to state S3; distribution 730 corresponds to state S4; distribution 732 corresponds to state S5; distribution 734 corresponds to state S6; and distribution 736 corresponds to state S7. For purpose of comparison, the memory cells were programmed to the same states (S0-S7) using the same programming parameters (e.g., program voltage step size, verify reference levels) as the example of FIG. 7A. Thus, the verify reference levels Vv1-Vv7 are the same FIGS. 7A and 7B. Likewise, the read reference levels Vr1-Vv7 are the same in FIGS. 7A and 7B.

The threshold voltage distribution 722 of the S0 state is significantly different than the threshold voltage distribution 702 of the S0 state in FIG. 7A. With reference to threshold voltage distribution 722, some of the memory cells have a Vt above the erase verify level (Vev), and some of the memory cells have a Vt above Vr1. It is possible that some of the memory cells in threshold voltage distribution 722 have a Vt above Vv1, although that is not depicted in FIG. 7B. The threshold voltage distributions the programmed states (S1-S7) may also be different from those in FIG. 7A.

In some embodiments, a count is made of memory cells have a Vt within a zone that is between the erase verify level (Vev) and the S1 verify level (Vv1). FIG. 7B depicts one embodiment of that zone 720. Zone 720 is between the Vr1 and Vv1. The zone can be defined based on other reference voltages. This count is used to determine a severity of memory hole misshape for the group, in some embodiments. A high count indicates a high severity of memory hole misshape for the group, in some embodiments. A low count indicates a low severity of memory hole misshape for the group, in some embodiments.

One or more program parameters are selected based on the count, in some embodiments. One program parameter selected based on the count is program step size, in one embodiment. For example, the program step size in step 660 of process 600 may be selected. A larger program step size results in faster programming and thus greater performance, in some embodiments. A smaller program step size results in slower programming, in some embodiments. However, the smaller program step size may allow a group having high severity of memory hole misshape to be reliably used. Another program parameter selected based on the count is Vv1, in some embodiments. Adjusting Vv1 changes the margin between VeV and Vv1. When Vv1 is moved, one or more of the other verify reference levels Vv2-Vv7 may also be moved (although typically Vv7 is not moved).

Figure 7C:
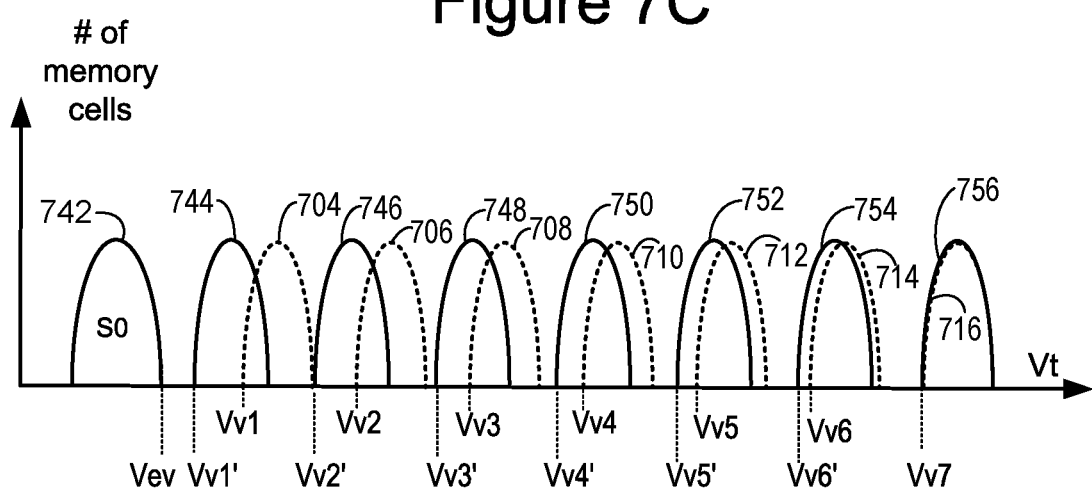
FIG. 7C shows eight threshold voltage distributions after programming using different program parameters than were used in the example of FIG. 7A.

FIG. 7C shows eight threshold voltage distributions 742-756 after programming using different program parameters than were used in the example of FIG. 7A. The different program parameters are used in response to determining that the severity of the memory hole mis-shape for the group is low, in one embodiment. The program parameters used in FIG. 7C may be used to increase programming performance. Distribution 742 corresponds to state S0; distribution 744 corresponds to state S1; distribution 746 corresponds to state S2; distribution 748 corresponds to state S3; distribution 750 corresponds to state S4; distribution 752 corresponds to state S5; distribution 754 corresponds to state S6; and distribution 756 corresponds to state S7. As noted, the programming performance may be increased in response to determining that the severity of the memory hole mis-shape for the group is below a threshold.

For purpose of comparison, threshold distributions 704-716 for programmed states S1-S7 from FIG. 7A are depicted in dashed lines. Memory cells were programmed from the erase state (S0) to the threshold distributions 744-756 using higher a performance level than was used in the example of FIG. 7A.

The memory cells were programmed to threshold distributions 744-756 using different programming parameters (e.g., program voltage step size, verify reference levels) than the example of FIG. 7A. One difference is that the program voltage step size is larger in the example of FIG. 7C. Another difference is that Vv1 is at a lower voltage in FIG. 7C than in FIG. 7A. Thus, Vv1 is closer to Vev in FIG. 7C than in FIG. 7A. Another difference is that the voltage difference between Vv1 to Vv7 is larger in FIG. 7C than in FIG. 7A. Having a larger gap between Vv1 to Vv7 can improve reliability due to increased voltage margin between the states.

Figure 7D:
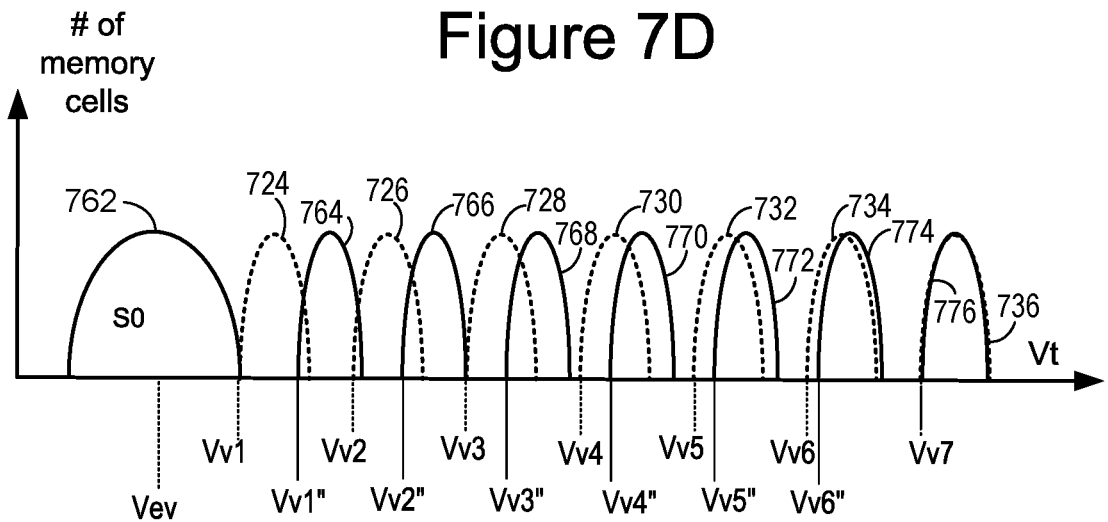
FIG. 7D shows threshold voltage distributions after programming in order to illustrate using different program parameters than were used in the example of FIG. 7C.

FIG. 7D shows threshold voltage distributions 762-776 after programming in order to illustrate using different program parameters than were used in the example of FIG. 7C. The different program parameters are used in response to determining that the severity of the memory hole mis-shape for the group is high, in one embodiment. Distribution 762 corresponds to state S0; distribution 764 corresponds to state S1; distribution 766 corresponds to state S2; distribution 768 corresponds to state S3; distribution 770 corresponds to state S4; distribution 772 corresponds to state S5; distribution 774 corresponds to state S6; and distribution 776 corresponds to state S7. The programming performance (e.g., programming speed) may be decreased in response to determining that the severity of the memory hole mis-shape is above a threshold. For example, the program step size may be decreased. However, using the smaller step size can help to form more precise threshold voltage distributions, which can improve reliability.

For purpose of comparison, threshold voltage distributions 724-736 for programmed states S1-S7 from FIG. 7B are depicted in dashed lines. The memory cells were programmed to threshold voltage distributions 764-776 using different programming parameters (e.g., program voltage step size, verify reference levels) than the example of FIG. 7B. One difference is that the program voltage step size is smaller in the example of FIG. 7D. Another difference is that Vv1 is at a higher voltage in FIG. 7D than in FIG. 7C. Thus, Vv1 is farther from Vev in FIG. 7D than in FIG. 7C. Another difference is that the voltage difference between Vv1 to Vv7 is smaller in FIG. 7D than in FIG. 7C. However, the smaller program step size may be used to compensate for the smaller gap between Vv1 to Vv7.

Figure 8:
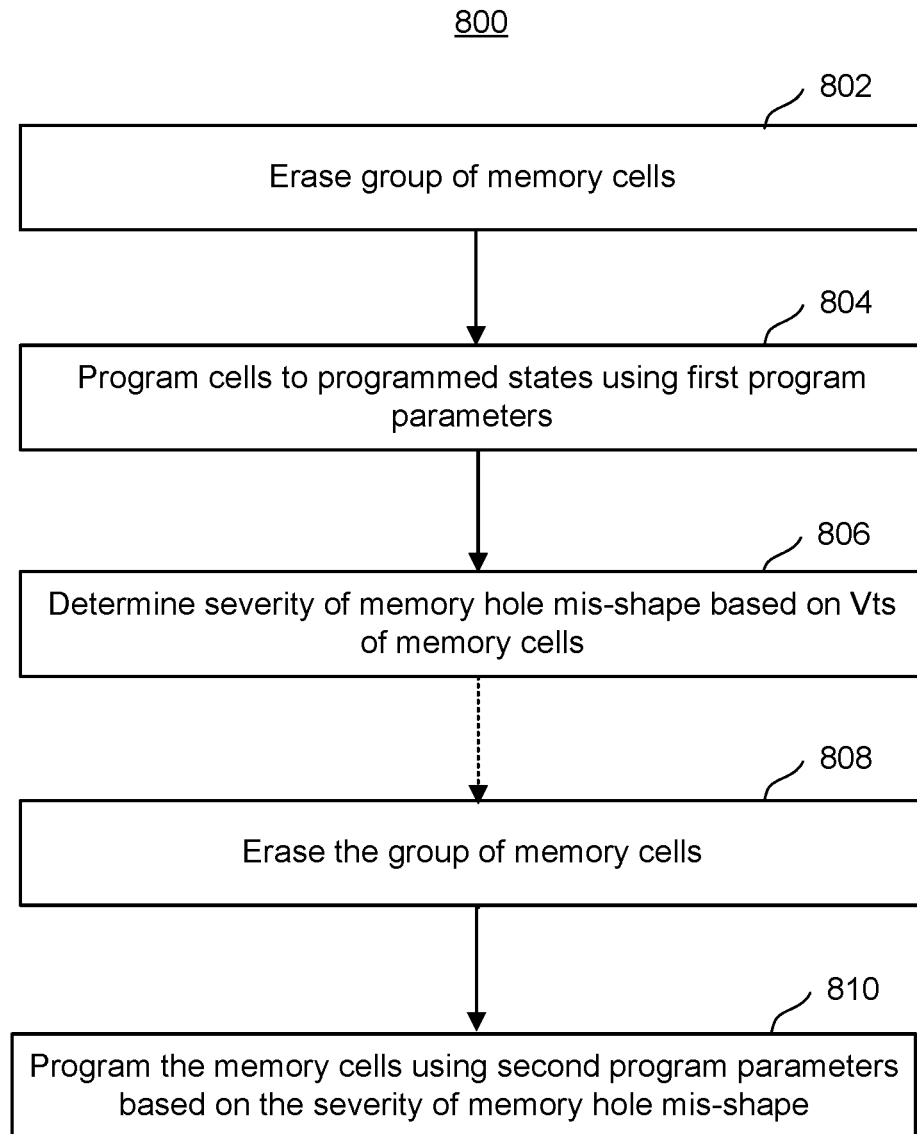
FIG. 8 is one embodiment of a process of programming memory cells, which is used to tailor one or more program parameters to a severity of memory hole mis-shape of a group of memory cells.

FIG. 8 is one embodiment of a process 800 of programming memory cells in a non-volatile storage device. The non-volatile storage device could be any non-volatile storage device described herein. The memory cells are in a 3D memory array, in some embodiments. The three-dimensional array comprises columns of non-volatile memory cells such as, but not limited to, the examples of FIGS. 4A-4E. Note that not all of the non-volatile memory holes will have a circular cross section, as in the example of FIG. 4E. Some memory cells may have a severe mis-shape as in the example of FG. 5. The process is used to tailor one or more program parameters to a severity of memory hole mis-shape of a group of memory cells, in one embodiment. This allows different groups to have different program parameters, based on the severity of memory hole mis-shape of the group. The groups could be any unit (e.g., memory cells connected to a word line, a block of memory cells, a plane, a memory die 108). The process 800 is performed by state machine 112 and/or controller 122 (or equivalently functioned circuits), in combination with all or a subset of the other circuits depicted in FIG. 1, in some embodiments.

Step 802 includes erasing a group of memory cells. The memory cells are erased to an erased state (e.g., S0 or Er). The upper boundary of the erased state is defined by an erase verify voltage (e.g., VeV). In other words, the erase verify voltage is used during the erase process to verify whether the memory cells are in the erase state. It is not required that every memory cell in the group has a Vt below the erase verify voltage for the erase to be complete. In some embodiments, a pre-determined number of memory cells may have a Vt above the erase verify voltage after the erase is complete. Note that the group could be the memory cells connected to one word line, as one example. When erasing this group, other memory cells may be erased as well. For example, an entire block of memory cells (of which the group is a part) may be erased together.

Step 804 includes programming memory cells in the group from the erase state to a plurality of programmed states using one or more first program parameters. The one or more program parameters may include, but are not limited to: 1) the program voltage step size between program loops; 2) a voltage gap between an erase-state verify voltage (e.g., Vev) and an A-state (or S1) verify voltage (e.g., Vv1); 3) one or more verify levels (e.g., any of Vv1 to Vv7) that are used to verify whether a memory cell has been programmed to its target state; and/or 4) a voltage gap between a first verify voltage (e.g., Vv1) for a lowest programmed state (e.g., S0) and a second verify voltage (e.g., Vv7 for a highest programmed state (e.g., S7). Note that more or fewer than seven programmed states may be used.

Step 806 includes determining a severity of memory hole mis-shape for the group based on Vts of the memory cells. In one embodiment, threshold voltages of memory cells are measured in order to determine the severity of memory hole mis-shape. There are a number of ways in which the threshold voltages of memory cells may be measured. In some embodiments, a count of memory cells is made based on the Vt measurements. In some embodiment, the severity of the memory hole mis-shape in the group is determined based on a number of memory cells having a threshold voltage in a zone. One example of the zone is depicted in FIG. 7B, but other zones can be used. In one embodiment, a count is made of the number of memory cells having a Vt that is in a zone that is between the erase verify level (Vev) and the S1 verify level (Vv1). The zone is not required to occupy the entire gap between the erase verify level (Vev) and the S1 verify level (Vv1). FIG. 7B depicts zone 720, which is used for the count in one embodiment. Zone 720 is between Vr1 and Vv1. The zone can be defined based on other reference voltages. The severity of the memory hole mis-shape for the group is based on the count, in some embodiments. A higher count indicates a more severe memory hole mis-shape for the group, in some embodiments. A lower count indicates a less severe memory hole mis-shape for the group, in some embodiments.

In one embodiment, a count is made of the number of memory cells having a Vt below Vev, in step 806. In this example, the region below Vev may be considered to be a zone that is used to determine the severity of the memory hole mis-shape in the group. The count of cells in this zone (below Vev) is compared to the number of memory cells that should be in the erase state (i.e., should have a Vt below Vev). In some embodiments, each of the data states (i.e., the erase state and the programmed states) each should have the same number of cells. For example, if there are eight data states, then ⅛ of the memory cells should be in the erase state. Thus, the number of memory cells that should be in the erase state, but have a Vt above Vev can be determined. A higher number indicates a more severe memory hole mis-shape of the group. Instead of making the count of number of memory cells having a Vt below Vev another level such as Vr1 could be used.

Step 806 is performed immediately after programming the memory cells in the group, in an embodiment. By immediately after programming the memory cells in the group it is meant without any intervening sense operations that could cause read disturb and without programming of another group of memory cells that could cause program disturb to the group. Thus, step 806 avoids the impact of read disturb and program disturb (from programming other groups), in an embodiment.

Step 806 determines a number of erase state memory cells that are program disturbed as a result of programming the group, in one embodiment. That is, the erase state cells should be inhibited from receiving programming when the group is programmed. However, if the erase state cells are not adequately inhibited that may suffer program disturb. Such memory cells are referred to herein as program disturbed erase state memory cells. Any of the techniques of measuring Vts described in step 806 may be used to determine a number of program disturbed erased state memory cells, in one embodiment. However, determining a number of program disturbed erased state memory cells is not limited to the examples described in step 806.

Step 808 includes erasing the group of memory cells. The arrow between steps 806 and 808 is dashed to indicate that significant time may pass between steps 806 and 808.

Step 810 includes programming memory cells in the group from the erase state to the plurality of programmed states using one or more second program parameters. The one or more second program parameters are based on the severity of the memory hole mis-shape for the group, in some embodiments.

In one embodiment, step 810 includes using a larger program step size for the one or more second program parameters relative to the one or more first program parameters in response to the severity of the memory hole mis-shape being below a threshold. In one embodiment, the threshold is a count of memory cells in a zone (e.g., zone 720). In one embodiment, step 810 includes verifying an A-state with an A-state verify voltage for the one or more second program parameters that is lower than an A-state verify voltage for the one or more first program parameters in response to the severity of the memory hole mis-shape being below the threshold.

In one embodiment, step 810 includes using a smaller program step size for the one or more second program parameters relative to the one or more first program parameters in response to the severity of the memory hole mis-shape being above a threshold. In one embodiment, the threshold is a count of memory cells in a zone (e.g., zone 720). In one embodiment, step 810 includes verifying an A-state with an A-state verify voltage for the one or more second program parameters that is higher than an A-state verify voltage for the one or more first program parameters in response to the severity of the memory hole mis-shape being above the threshold.

Figure 9:
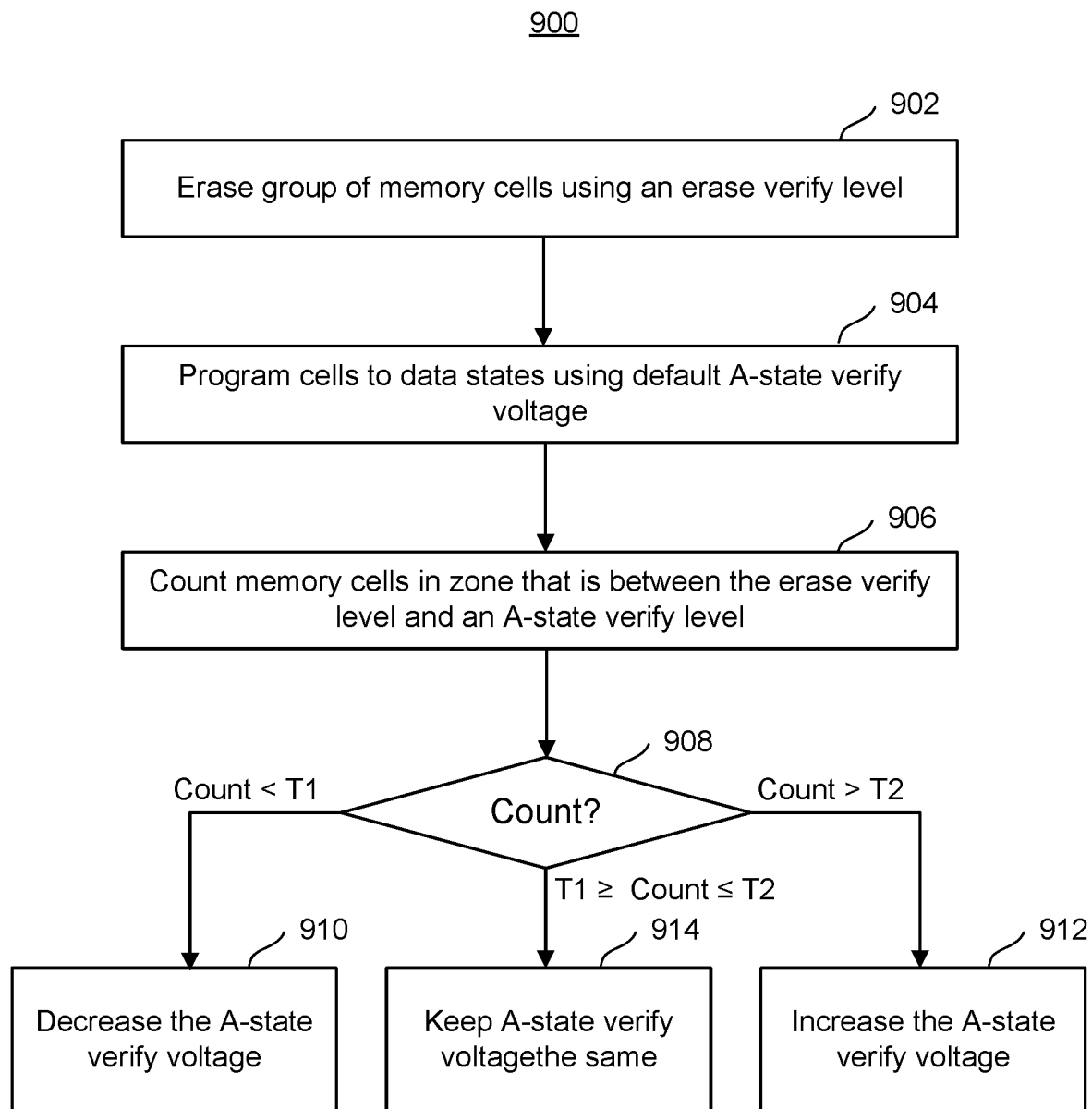
FIG. 9 is flowchart of an embodiment of a process in which an A-state verify voltage is adjusted based on a count of memory cells in a zone between an erase verify voltage and the A-state verify voltage.

FIG. 9 is flowchart of an embodiment of a process 900 in which an A-state verify voltage is adjusted based on a count of memory cells in a zone between an erase verify voltage and an A-state verify voltage. Various steps in process 900 may be used in process 800. However, process 900 can be performed independent of process 800. The process 900 is performed by state machine 112 and/or controller 122 (or equivalently functioned circuits), in combination with all or a subset of the other circuits depicted in FIG. 1, in some embodiments.

Step 902 includes erasing a group of memory cells. The memory cells are erased to an erased state (e.g., S0 or Er). An erase verify voltage (e.g., VeV) is used during the erase process to verify whether the memory cells are in the erase state. It is not required that every memory cell in the group has a Vt below the erase verify voltage for the erase to be complete. In some embodiments, a pre-determined number of memory cells may have a Vt above the erase verify voltage after the erase is complete.

Step 904 includes programming memory cells from the erase state to a plurality of programmed states using a default A-state verify voltage. The default A-state verify voltage refers to a voltage used without regard to severity of memory hole mis-shape, in some embodiments. An example of the default A-state verify voltage is Vv1 in any of FIGS. 7A-7D. Step 904 may be used in an embodiment of step 804 of process 800.

Step 906 includes determining a count of the number of memory cells having a Vt that is in a zone that is between the erase verify level (Vev) and the S1 verify level (Vv1). The zone is not required to occupy the entire gap between the erase verify level (Vev) and the S1 verify level (Vv1). FIG. 7B depicts zone 720, which is used for the count in one embodiment. Zone 720 is between Vr1 and Vv1. The zone can be defined based on other reference voltages. Step 906 is performed immediately after programming the memory cells, in an embodiment. Thus, any impact of read disturb on the memory cells is avoided, in an embodiment. Step 906 may be used in an embodiment of step 806 of process 800.

Step 908 includes is a determination of how to set the A-state verify voltage based on the count. The A-state verify level will be used the next time that this group of memory cells is programmed. If the count is relatively low (below a first threshold T1), then the A-state verify voltage is decreased in step 910. An example of decreasing the A-state verify voltage is to decrease from Vv1 to Vv1', as depicted in FIG. 7C. An example is to decrease the A-state verify voltage by 100 mV from the default voltage. Other verify voltages may also be decreased. For example, one or more of Vv2-Vv6 are decreased to Vv2'-Vv6', respectively. An example is to decrease the B-state verify voltage by 80 mV from the default voltage, decrease the C-state verify voltage by 60 mV from the default voltage, decrease the D-state verify voltage by 40 mV from the default voltage, decrease the E-state verify voltage by 30 mV from the default voltage, decrease the F-state verify voltage by 20 mV from the default voltage, and to leave the G-state verify voltage at the default voltage.

If the count is relatively high (above a second threshold T2), then the A-state verify voltage is increased in step 912. An example of increasing the A-state verify voltage is to decrease from Vv1 to Vv1", as depicted in FIG. 7D. An example is to increase the A-state verify voltage by 100 mV from the default voltage. Other verify voltages may also be increased. For example, one or more of Vv2-Vv6 are increased to Vv2"-Vv6", respectively. An example is to increase the B-state verify voltage by 80 mV from the default voltage, increase the C-state verify voltage by 60 mV from the default voltage, increase the D-state verify voltage by 40 mV from the default voltage, increase the E-state verify voltage by 30 mV from the default voltage, increase the F-state verify voltage by 20 mV from the default voltage, and to leave the G-state verify voltage at the default voltage.

If the count is neither high nor low (between the first threshold T1 and the second threshold T2), then the A-state verify voltage is kept the same in step 914. Other verify voltages are also kept the same, in one embodiment.

Step 910 is performed in one embodiment of step 810 of process 800 (depending on the count). Step 912 is performed in one embodiment of step 810 of process 800. Both steps 910 and 912 are performed in one embodiment of step 810 of process 800 (depending on the count). Steps 910, 912, and 914 are performed in one embodiment of step 810 of process 800 (depending on the count).

Figure 10:
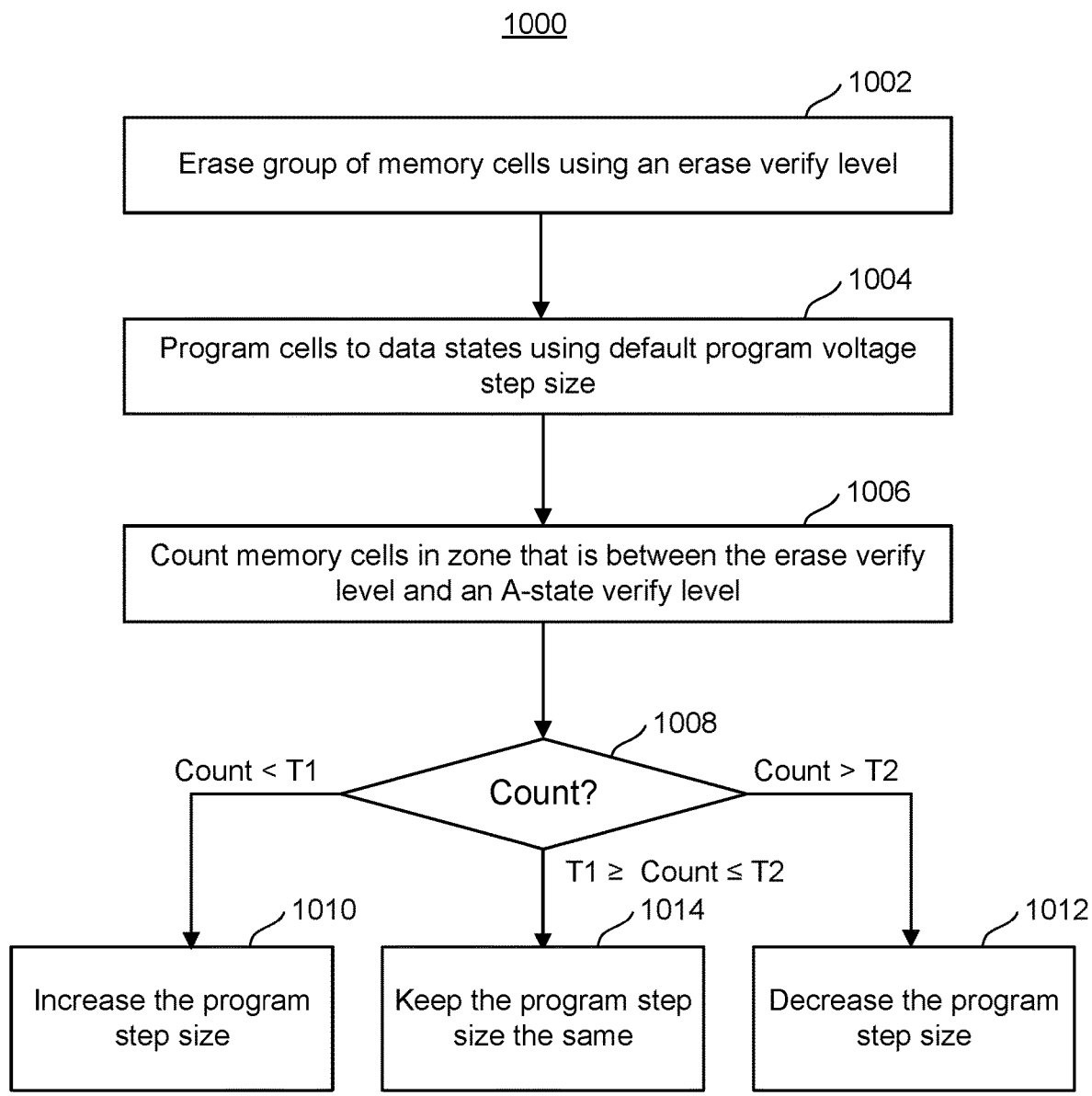
FIG. 10 is flowchart of an embodiment of a process in which the program step size is adjusted based on a count of memory cells in a zone between an erase verify voltage and an A-state verify voltage.

FIG. 10 is flowchart of an embodiment of a process 1000 in which the program step size is adjusted based on a count of memory cells in a zone between an erase verify voltage and an A-state verify voltage. Various steps in process 1000 may be used in process 800. However, process 1000 can be performed independent of process 800. The process 1000 is performed by state machine 112 and/or controller 122 (or equivalently functioned circuits), in combination with all or a subset of the other circuits depicted in FIG. 1, in some embodiments.

Step 1002 includes erasing a group of memory cells. The memory cells are erased to an erased state (e.g., S0 or Er). An erase verify voltage (e.g., VeV) is used during the erase process to verify whether the memory cells are in the erase state. It is not required that every memory cell in the group has a Vt below the erase verify voltage for the erase to be complete. In some embodiments, a pre-determined number of memory cells may have a Vt above the erase verify voltage after the erase is complete.

Step 1004 includes programming memory cells from the erase state to a plurality of programmed states using a default program voltage step size. The default program voltage step size refers to a program voltage step size used without regard to severity of memory hole mis-shape, in some embodiments. An example of a default program voltage step size is 0.6V. The default program voltage step could be higher or lower. Step 1004 may be used in an embodiment of step 804 of process 800.

Step 1006 includes determining a count of the number of memory cells having a Vt that is in a zone that is between the erase verify level (Vev) and the S1 verify level (Vv1). The zone is not required to occupy the entire gap between the erase verify level (Vev) and the S1 verify level (Vv1). FIG. 7B depicts zone 720, which is used for the count in one embodiment. Zone 720 is between Vr1 and Vv1. The zone can be defined based on other reference voltages. Step 1006 is performed immediately after programming the memory cells, in one embodiment. Step 906 may be used in an embodiment of step 806 of process 800.

Step 1008 includes is a determination of how to set the program voltage step size based on the count. If the count is relatively low (below a first threshold T1), then the program voltage step size is increased in step 1010. An example is to increase the program voltage step size by 0.05V from the default. For example, the program voltage step size could be increased from 0.6V to 0.65V. The increase could be greater or less than 0.05V.

If the count is relatively high (above a second threshold T2), then the program voltage step size is decreased in step 1012. An example is to decrease the program voltage step size by 0.05V from the default. For example, the program voltage step size could be decreased from 0.6V to 0.55V. The increase could be greater or less than 0.05V. Note that the thresholds T1, T2 may be same as, or different from, the thresholds T1, T2 used in process 900.

If the count is neither high nor low (between the first threshold T1 and the second threshold T2), then the program voltage step size is kept the same in step 1014.

Step 1010 is performed in one embodiment of step 810 of process 800 (depending on the count). Step 1012 is performed in one embodiment of step 810 of process 800. Both steps 1010 and 1012 are performed in one embodiment of step 810 of process 800 (depending on the count). Steps 1010, 1012, and 1014 are performed in one embodiment of step 810 of process 800 (depending on the count).

Figure 11:
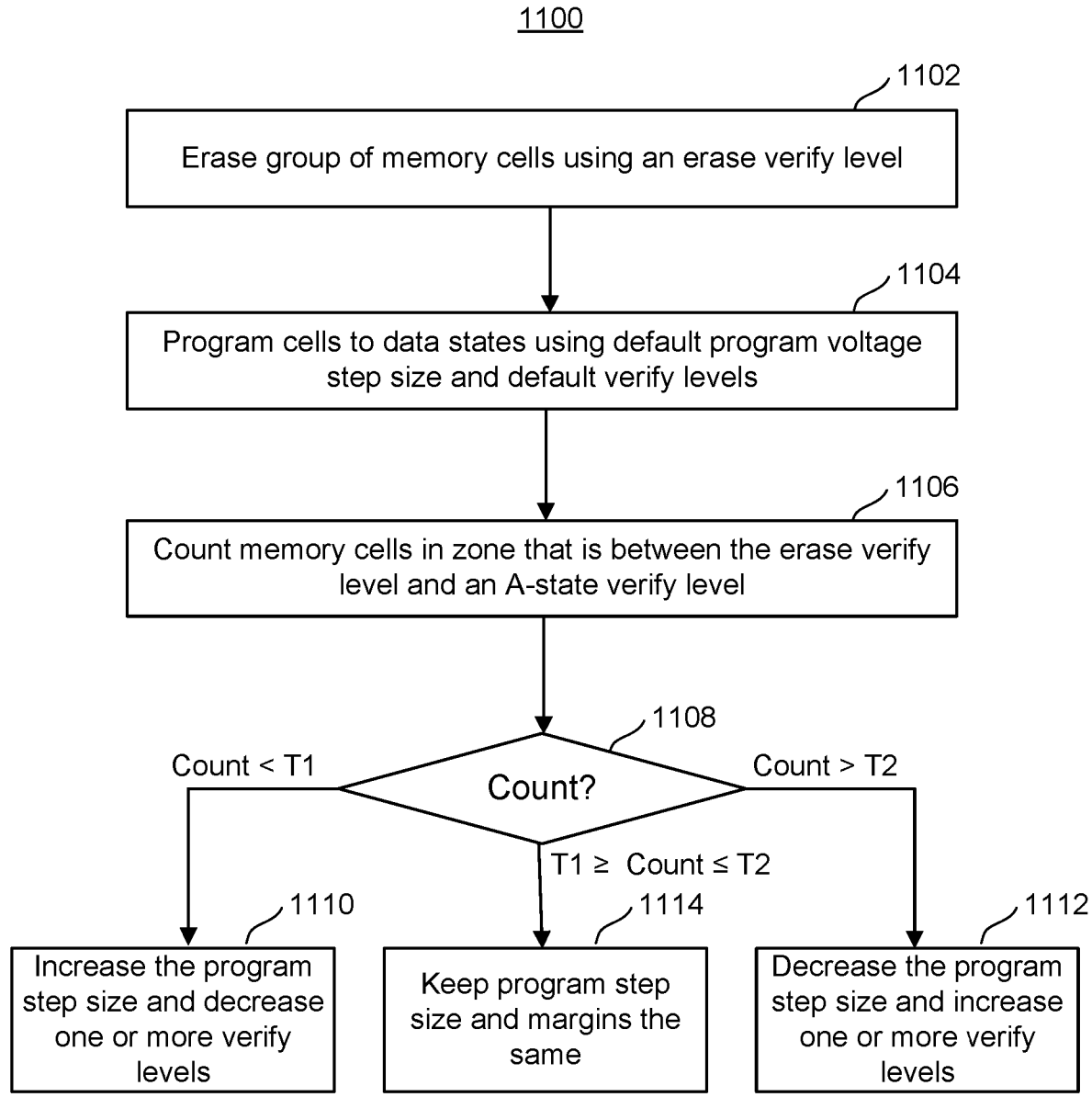
FIG. 11 is flowchart of an embodiment of a process in which both the program step size and one or more verify levels are adjusted based on a count of memory cells in a zone between an erase verify voltage and an A-state verify voltage.

The actions performed in steps 910-914 of process 900 may be combined with the actions in step 1010-1014 of process 1000. In other words, both the program step size and one or more verify voltages may be adjusted. FIG. 11 is flowchart of an embodiment of a process 1100 in which both the program step size and one or more verify levels are adjusted based on a count of memory cells in a zone between an erase verify voltage and an A-state verify voltage. Various steps in process 1100 may be used in process 800. However, process 1100 can be performed independent of process 800. The process 1100 is performed by state machine 112 and/or controller 122 (or equivalently functioned circuits), in combination with all or a subset of the other circuits depicted in FIG. 1, in some embodiments.

Step 1102 includes erasing a group of memory cells. The memory cells are erased to an erased state (e.g., S0 or Er). An erase verify voltage (e.g., VeV) is used during the erase process to verify whether the memory cells are in the erase state. It is not required that every memory cell in the group has a Vt below the erase verify voltage for the erase to be complete. In some embodiments, a pre-determined number of memory cells may have a Vt above the erase verify voltage after the erase is complete.

Step 1104 includes programming memory cells from the erase state to a plurality of programmed states using a default program voltage step size and default verify voltages. Examples of a default program voltage step size and default verify voltages were discussed in connection with steps 1004, and 904.

Step 1106 includes determining a count of the number of memory cells having a Vt that is in a zone that is between the erase verify level (Vev) and the S1 verify level (Vv1). Step 1106 is performed immediately after programming the memory cells, in one embodiment. Step 1106 may be used in an embodiment of step 806 of process 800. An example of counting based on zone 720 was discussed in connection with steps 906 and 1006.

Step 1108 includes is a determination of how to set the program voltage step size and one or more verify voltages based on the count. If the count is relatively low (below a first threshold T1), then the program voltage step size is increased and one or more verify voltages are decreased in step 1110. Examples of increasing the voltage step size and verify voltages were discussed in connection with steps 1010 and 910.

If the count is relatively high (above a second threshold T2), then the program voltage step size is increased and one or more verify voltages are increased in step 1012. Examples of decreasing the voltage step size and decreasing the verify voltages were discussed in connection with steps 1012 and 912.

If the count is neither high nor low (between the first threshold T1 and the second threshold T2), then the program voltage step size and the verify voltages is kept the same in step 1114.

Step 1110 is performed in one embodiment of step 810 of process 800 (depending on the count). Step 1112 is performed in one embodiment of step 810 of process 800. Both steps 1110 and 1112 are performed in one embodiment of step 810 of process 800 (depending on the count). Steps 1110, 1112, and 1114 are performed in one embodiment of step 810 of process 800 (depending on the count).

A first embodiment disclosed herein includes an apparatus comprising non-volatile memory cells, and one or more control circuits in communication with the non-volatile memory cells. The one or more control circuits are configured to: program, using a first program parameter, a group of non-volatile memory cells from an erase state to a plurality of programmed states; measure threshold voltages of the group to determine a severity of memory hole mis-shape in the group; and program the group from the erase state to the plurality of programmed states using a second program parameter selected based on the severity of the memory hole mis-shape in the group.

In a second embodiment, and in furtherance of the first embodiment, the one or more control circuits are further configured to use a larger program step size for the second program parameter relative to the first program parameter in response to the severity of the memory hole mis-shape being below a threshold.

In a third embodiment, and in furtherance of the first or second embodiment, the one or more control circuits are further configured to use a larger voltage gap between a first verify voltage for a lowest of the programmed states and a second verify voltage for a highest of the programmed states in combination with using the larger program step size in response to the severity of the memory hole mis-shape being below the threshold.

In a fourth embodiment, and in furtherance of any of the first to third embodiments, the one or more control circuits are further configured to verify an A-state of the plurality of programmed states with an A-state verify voltage for the second program parameter that is lower than an A-state verify voltage for the first program parameter in response to the severity of the memory hole mis-shape being below a threshold.

In a fifth embodiment, and in furtherance of any of the first to fourth embodiments, the one or more control circuits are further configured to use a smaller program step size for the second program parameter relative to the first program parameter in response to the severity of the memory hole mis-shape being above a threshold.

In a sixth embodiment, and in furtherance of any of the first to fifth embodiments, the one or more control circuits are further configured to use a smaller voltage gap between a first verify voltage for a lowest of the programmed states and a second verify voltage for a highest of the programmed states in combination with using the smaller program step size in response to the severity of the memory hole mis-shape being above the threshold.

In a seventh embodiment, and in furtherance of any of the first to sixth embodiments, the one or more control circuits are further configured to verify an A-state of the plurality of programmed states with an A-state verify voltage for the second program parameter that is higher than an A-state verify voltage for the first program parameter in response to the severity of the memory hole mis-shape being above a threshold.

In a ninth embodiment, and in furtherance of any of the first to seventh embodiments, the one or more control circuits are further configured to determine the severity of the memory hole mis-shape in the group based on a number of memory cells having a threshold voltage in a zone.

In a tenth embodiment, and in furtherance of any of the first to ninth embodiments, the memory hole mis-shape comprises memory hole striation.

In an eleventh embodiment, and in furtherance of any of the first to tenth embodiments, the non-volatile memory cells comprise annular films of memory cell material. The one or more control circuits are configured to determine a severity of mis-shape of the annular films of memory cell material.

An embodiment includes a method of operating non-volatile memory. The method comprises erasing a group of non-volatile memory cells to a level below an erase-state verify voltage that defines an upper boundary of an erase state; programming the group from the erase state to a plurality of programmed states, including verifying an A-state with a default A-state verify voltage; determining, immediately after programming the group, a number of memory cells that are in a zone that is between the erase-state verify voltage and the default A-state verify voltage; erasing the group to the erase state after determining the number of memory cells that are in the zone; and programming the group from the erase state to the plurality of programmed states, including verifying the A-state with a verify voltage that is based on the number of memory cells that are in the zone.

An embodiment includes a non-volatile storage device comprising: a three-dimensional array comprising columns of non-volatile memory cells; and one or more control circuits. The one or more control circuits are configured to program a group of non-volatile memory cells from an erase state to a plurality of programmed states using a first program voltage step size; determine a number of erase state memory cells that are program disturbed as a result of programming the group; erase the group after programming the group using the first program voltage step size; and program the group using a second program voltage step size that is based on the number of program disturbed erase state memory cells when using the first program voltage step size.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to non-volatile memory cells, the one or more control circuits configured to:
program, based on a first set of one or more program parameters, a group of the non-volatile memory cells;
measure threshold voltages of the group, after programming the group based on the first set of one or more program parameters, to determine a severity of memory hole mis-shape in the group;
erase the group after determining the severity of the memory hole mis-shape; and
program the group based on a second set of one or more program parameters based on the severity of the memory hole mis-shape in the group.

2. The apparatus of claim 1, wherein the one or more control circuits are further configured to use a larger program voltage step size in the second set of program parameters relative to a program voltage step size in the first set of program parameters in response to the severity of the memory hole mis-shape being below a threshold.

3. The apparatus of claim 2, wherein:
the one or more control circuits are further configured to use a larger voltage gap between a first verify voltage for a lowest threshold voltage state of a plurality of programmed states and a second verify voltage for a highest threshold voltage state of the plurality of programmed states in combination with using the larger program voltage step size in response to the severity of the memory hole mis-shape being below the threshold.

4. The apparatus of claim 1, wherein the one or more control circuits are further configured to use a first voltage level to verify a first programmed state having a lowest threshold voltage range of a plurality of programmed states in the first set of program parameters and to use a second voltage level to verify the first programmed state in the second set of program parameters, wherein the second voltage level is lower than the first voltage level in response to the severity of the memory hole mis-shape being below a threshold.

5. The apparatus of claim 1, wherein the one or more control circuits are further configured to use a smaller program voltage step size in the second set of program parameters relative to a program voltage step size in the first set of program parameters in response to the severity of the memory hole mis-shape being above a threshold.

6. The apparatus of claim 5, wherein the one or more control circuits are further configured to use a first voltage level to verify a first programmed state having a lowest threshold voltage range of a plurality of programmed states in the first set of program parameters and to use a second voltage level to verify the first programmed state in the second set of program parameters, wherein the second voltage level is higher than the first voltage level in response to the severity of the memory hole mis-shape being above the threshold.

7. The apparatus of claim 1, wherein the one or more control circuits are further configured to use a smaller voltage gap between a first verify voltage for a lowest threshold voltage state of a plurality of programmed states and a second verify voltage for a highest threshold voltage state of the plurality of programmed states in response to the severity of the memory hole mis-shape being above a threshold.

8. The apparatus of claim 1, wherein the one or more control circuits are further configured to determine the severity of the memory hole mis-shape in the group based on a number of memory cells having a threshold voltage in a zone of threshold voltages.

9. The apparatus of claim 8, wherein the zone is between a read reference level associated with a first programmed state having a lowest threshold voltage range of a plurality of programmed states and a verify reference level associated with the first programmed state.

10. The apparatus of claim 8, wherein the zone is between an erase verify level associated with an erase state and a verify reference level associated with a first programmed state having a lowest threshold voltage range of a plurality of programmed states.

11. The apparatus of claim 8, wherein the zone is below an erase verify level associated with an erase state.

12. A method of operating non-volatile memory, the method comprising:
 erasing a group of non-volatile memory cells to a level below an erase-state verify voltage that defines an upper boundary of an erase state;
 programming the group using a first set of programming parameters that include a first program voltage step size;
 determining a number of program disturbed erase state memory cells after programming the group using the first set of programming parameters;
 erasing the group to the erase state after determining the number of program disturbed erase state memory cells; and
 programming the group using a second set of programming parameters that include a second program voltage step size that is greater than the first program voltage step size in response to the number of program disturbed erase state memory cells being below a threshold.

13. The method of claim 12, wherein the first program voltage step size is a default program voltage step size.

14. A non-volatile storage device comprising:
 read/write circuits configured to connect to a three-dimensional array comprising non-volatile memory cells; and
 a control circuit in communication with the read/write circuits, wherein the control circuit is configured to control the read/write circuits to:
  program a group of the non-volatile memory cells based on a first set of program parameters that include a first program voltage step size;
  determine a number of memory cells in the group that have a threshold voltage in a zone of threshold voltages after programming the group based on the first set of program parameters;
  erase the group after programming the group based on the first set of program parameters; and
  program the group based on a second set of program parameters that include a second program voltage step size, wherein the second program voltage step size is based on the number of memory cells that have a threshold voltage in the zone after programming based on the first set of program parameters.

15. The non-volatile storage device of claim 14, wherein the zone is between a read reference level associated with a first programmed state having a lowest threshold voltage range of a plurality of programmed states and a verify reference level associated with the first programmed state.

16. The non-volatile storage device of claim 14, wherein the zone is between an erase verify level associated with an erase state and a verify reference level associated with a first programmed state having a lowest threshold voltage range of a plurality of programmed states and a verify reference level associated with the first programmed state.

17. The non-volatile storage device of claim 14, wherein the zone is below an erase verify level associated with an erase state.

18. The non-volatile storage device of claim 14, wherein to program the group based on the second set of program parameters the control circuit is further configured to:
 use a larger program voltage step size for the second program voltage step size than the first program voltage step size in response to the number of memory cells in the zone being below a first number; and
 use a smaller program voltage step size for the second program voltage step size than the first program voltage step size in response to the number of memory cells in the zone being above a second number.

19. The non-volatile storage device of claim 18, wherein the control circuit is further configured to:
 verify, when programming the group based on the second set of program parameters, an A-state based on an A-state verify voltage that is lower than an A-state verify voltage used when programming with the first set of program parameters in response to the number of memory cells in the zone being below the first number; and
 verify, when programming the group based on the second set of program parameters, the A-state based on an A-state verify voltage that is higher than the A-state verify voltage used when programming with the first set of program parameters in response to the number of memory cells in the zone being above the second number.

20. The non-volatile storage device of claim 14, wherein the memory cells comprise annular films of memory cell material, the control circuit is further configured to determine a severity of mis-shape of the annular films based on the number of memory cells in the zone of threshold voltages after programming using the first set of program parameters.

* * * * *